US008688303B2

(12) United States Patent
Stevens et al.

(10) Patent No.: US 8,688,303 B2
(45) Date of Patent: Apr. 1, 2014

(54) APPARATUS AND METHODS FOR CONTROL OF A VEHICLE

(75) Inventors: Jon M. Stevens, Manchester, NH (US); John David Heinzmann, Manchester, NH (US); Patrick A. Hussey, Hollis, NH (US); Benjamin C. Shaffer, Bedford, NH (US)

(73) Assignee: Segway, Inc., Bedford, NH (US)

( * ) Notice: Subject to any disclaimer, the term of this patent is extended or adjusted under 35 U.S.C. 154(b) by 0 days.

(21) Appl. No.: 13/036,728

(22) Filed: Feb. 28, 2011

(65) Prior Publication Data

US 2011/0213522 A1 Sep. 1, 2011

Related U.S. Application Data

(60) Provisional application No. 61/308,659, filed on Feb. 26, 2010.

(51) Int. Cl.
*B60L 9/00* (2006.01)
*B60L 11/00* (2006.01)
*B60L 1/00* (2006.01)
*B60L 3/00* (2006.01)
*B60L 7/00* (2006.01)

(52) U.S. Cl.
USPC ........ 701/22; 701/70; 701/1; 700/29; 702/63; 123/179.3; 123/179.28; 123/179.4

(58) Field of Classification Search
None
See application file for complete search history.

(56) References Cited

U.S. PATENT DOCUMENTS

| 584,127 A | 6/1897 | Draullette et al. |
| 693,132 A * | 2/1902 | Heiden .......................... 105/250 |
| 734,109 A | 7/1903 | Tolcher |
| 3,145,797 A | 8/1964 | Taylor ............................. 180/21 |
| 3,260,324 A | 7/1966 | Suarez ............................ 180/10 |
| 3,399,742 A | 9/1968 | Malick ............................ 180/21 |

(Continued)

FOREIGN PATENT DOCUMENTS

| CN | 1377318 A | 10/2002 |
| CN | 101437719 A | 5/2009 |

(Continued)

OTHER PUBLICATIONS

Ding, Ning et al. Voltage Sag Disturbance Detection Based on RMS Voltage Method, North China Power Research Institute Co. Ltd. 2009.*

(Continued)

*Primary Examiner* — James Trammell
*Assistant Examiner* — Jean-Paul Cass
(74) *Attorney, Agent, or Firm* — Pierce Atwood LLP; Joseph M. Maraia

(57) ABSTRACT

Method for controlling a vehicle that includes a support, at least one wheel, a platform coupled to the at least one wheel, a coupling structure having a support portion coupled to the support and a platform portion coupled to the platform that allows the support portion to move or slide fore and aft with respect to the platform portion, an actuator coupled to the coupling structure to control the position of the support portion relative to the platform portion, a drive coupled to the at least one wheel to deliver power to the at least one wheel to propel the vehicle and maintain the platform level, and a controller coupled to the drive to control the drive and coupled to the actuator to control the actuator.

6 Claims, 12 Drawing Sheets

(56) References Cited

U.S. PATENT DOCUMENTS

| | | | |
|---|---|---|---|
| 3,446,304 A | 5/1969 | Alimanestiano | 180/9.24 |
| 3,580,344 A | 5/1971 | Floyd | 180/8 A |
| 4,062,558 A | 12/1977 | Wasserman | 280/205 |
| 4,109,741 A | 8/1978 | Gabriel | 180/21 |
| 4,151,892 A | 5/1979 | Francken | 180/77 H |
| 4,222,449 A | 9/1980 | Feliz | 180/8 A |
| 4,293,052 A | 10/1981 | Daswick et al. | 180/219 |
| 4,560,022 A | 12/1985 | Kassai | 180/65.1 |
| 4,566,707 A | 1/1986 | Nitzberg | 180/8.2 |
| 4,571,844 A | 2/1986 | Komasaku et al. | 33/366 |
| 4,624,469 A | 11/1986 | Bourne, Jr. | 280/112 A |
| 4,709,772 A | 12/1987 | Brunet | 180/8.2 |
| 4,790,548 A | 12/1988 | Decelles et al. | 280/5.26 |
| 4,794,999 A | 1/1989 | Hester | 180/8.2 |
| 4,809,804 A | 3/1989 | Houston et al. | 180/65.5 |
| 4,834,200 A | 5/1989 | Kajita | 180/8.1 |
| 4,998,596 A | 3/1991 | Miksitz | 180/213 |
| 5,126,585 A * | 6/1992 | Boys | 307/66 |
| 5,221,883 A | 6/1993 | Takenaka et al. | 318/568.12 |
| 5,248,007 A | 9/1993 | Watkins et al. | 180/9.32 |
| 5,314,034 A | 5/1994 | Chittal | 180/21 |
| 5,366,036 A | 11/1994 | Perry | 180/65.1 |
| 5,376,868 A | 12/1994 | Toyoda et al. | 318/587 |
| 5,419,624 A | 5/1995 | Adler et al. | 303/112 |
| 5,439,240 A | 8/1995 | Tichenor et al. | 280/250.1 |
| 5,638,265 A * | 6/1997 | Gabor | 363/89 |
| 5,701,965 A | 12/1997 | Kamen et al. | 180/7.1 |
| 5,701,968 A | 12/1997 | Wright-Ott et al. | 180/65.1 |
| 5,791,425 A | 8/1998 | Kamen et al. | 180/7.1 |
| 5,883,796 A * | 3/1999 | Cheng et al. | 363/40 |
| 5,971,091 A | 10/1999 | Kamen et al. | 180/218 |
| 5,973,463 A | 10/1999 | Okuda et al. | 318/430 |
| 5,975,225 A | 11/1999 | Kamen et al. | 180/7.1 |
| 6,003,624 A | 12/1999 | Jorgensen et al. | 180/6.5 |
| 6,050,357 A | 4/2000 | Staelin et al. | 180/65.1 |
| 6,059,062 A | 5/2000 | Staelin et al. | 180/181 |
| 6,118,676 A * | 9/2000 | Divan et al. | 363/34 |
| 6,131,057 A | 10/2000 | Tamaki et al. | 701/22 |
| 6,223,104 B1 | 4/2001 | Kamen et al. | 701/1 |
| 6,225,977 B1 | 5/2001 | Li | 345/156 |
| 6,268,712 B1 | 7/2001 | Laig-Hörstebrock et al. | |
| 6,288,505 B1 * | 9/2001 | Heinzmann et al. | 318/139 |
| 6,302,230 B1 | 10/2001 | Kamen et al. | 180/171 |
| 6,311,794 B1 | 11/2001 | Morrell et al. | 180/8.3 |
| 6,313,617 B1 * | 11/2001 | Engelmann et al. | 323/285 |
| 6,332,103 B1 | 12/2001 | Steenson, Jr. et al. | 701/1 |
| 6,538,411 B1 | 3/2003 | Field et al. | 318/638 |
| 6,553,271 B1 | 4/2003 | Morrell | 700/75 |
| 6,571,892 B2 * | 6/2003 | Kamen et al. | 180/8.2 |
| 6,581,714 B1 | 6/2003 | Kamen et al. | 180/333 |
| 6,657,321 B2 * | 12/2003 | Sinha | 307/68 |
| 6,665,198 B2 * | 12/2003 | Tasi et al. | 363/39 |
| 6,789,640 B1 | 9/2004 | Arling et al. | 180/282 |
| 6,866,107 B2 * | 3/2005 | Heinzmann et al. | 180/7.1 |
| 6,868,931 B2 | 3/2005 | Morrell et al. | |
| 6,931,332 B2 * | 8/2005 | Phansalkar et al. | 702/63 |
| 6,992,452 B1 * | 1/2006 | Sachs et al. | 318/434 |
| 7,004,271 B1 | 2/2006 | Kamen et al. | 180/21 |
| 7,015,667 B2 * | 3/2006 | Patel et al. | 318/432 |
| 7,091,724 B2 * | 8/2006 | Heinzmann et al. | 324/546 |
| 7,463,985 B2 * | 12/2008 | Cox | 702/60 |
| 7,963,264 B2 * | 6/2011 | Reynolds | 123/179.3 |
| 8,080,957 B2 * | 12/2011 | Miura et al. | 318/400.23 |
| 2002/0063006 A1 | 5/2002 | Kamen et al. | 180/171 |
| 2002/0121394 A1 | 9/2002 | Kamen et al. | 180/41 |
| 2003/0014167 A1 | 1/2003 | Pedersen et al. | 701/37 |
| 2003/0023364 A1 | 1/2003 | Schmitz et al. | |
| 2004/0007425 A1 | 1/2004 | Kamen et al. | |
| 2004/0162683 A1 * | 8/2004 | Verbrugge et al. | 702/64 |
| 2005/0017733 A1 * | 1/2005 | Heinzmann et al. | 324/546 |
| 2005/0073315 A1 | 4/2005 | Murakami et al. | |
| 2005/0212471 A1 * | 9/2005 | Patel et al. | 318/432 |
| 2005/0248317 A1 * | 11/2005 | Yang | 320/132 |
| 2006/0106553 A1 | 5/2006 | Melichar | |
| 2006/0249313 A1 | 11/2006 | Kamen et al. | 180/7.1 |
| 2007/0120530 A1 | 5/2007 | Nozaki | |
| 2007/0145697 A1 | 6/2007 | Kamen et al. | 280/11 |
| 2009/0105908 A1 | 4/2009 | Casey et al. | |
| 2009/0107443 A1 * | 4/2009 | Sarbacker et al. | 123/179.28 |
| 2009/0266631 A1 | 10/2009 | Kikuchi | |
| 2009/0312908 A1 | 12/2009 | Van Den Brink | |
| 2009/0322101 A1 * | 12/2009 | Reynolds | 290/38 R |
| 2010/0004807 A1 * | 1/2010 | Kydd | 701/22 |
| 2010/0052618 A1 | 3/2010 | Inoue et al. | |
| 2010/0114468 A1 | 5/2010 | Field et al. | |
| 2010/0168993 A1 | 7/2010 | Doi et al. | |
| 2010/0201320 A1 * | 8/2010 | Coe et al. | 320/129 |
| 2010/0207564 A1 | 8/2010 | Robinson | |
| 2010/0268579 A1 * | 10/2010 | Momoh | 705/14.1 |
| 2011/0101897 A1 * | 5/2011 | Wei et al. | 318/400.3 |

FOREIGN PATENT DOCUMENTS

| | | | | |
|---|---|---|---|---|
| DE | 44 04 594 A1 | 8/1995 | | B62D 1/12 |
| EP | 0 537 698 | 4/1993 | | B62D 55/075 |
| EP | 0 958 978 | 11/1999 | | B60T 8/00 |
| EP | 2 017 172 | 1/2009 | | |
| FR | 980 237 | 5/1951 | | 10/1 |
| GB | 2 139 576 A | 11/1984 | | B62B 5/02 |
| GB | 2388579 | 11/2003 | | B60K 23/08 |
| JP | 57-87766 | 6/1982 | | B62D 37/00 |
| JP | 62-12810 | 1/1987 | | G01C 19/04 |
| JP | 63-305082 | 12/1988 | | G05D 1/08 |
| JP | 4201793 | 7/1992 | | B62K 1/00 |
| JP | 2008137422 A | 6/2008 | | |
| WO | 89/06117 | 7/1989 | | A61G 5/04 |
| WO | 96/23478 | 8/1996 | | A61G 5/04 |
| WO | 00/74623 | 12/2000 | | |
| WO | 00/75001 | 12/2000 | | B62K 1/00 |
| WO | 03/106250 | 12/2003 | | |
| WO | 2004/007264 | 1/2004 | | B62D 51/02 |
| WO | 2009/004844 | 1/2009 | | |

OTHER PUBLICATIONS

McGranaghan, Mark Voltage Sags in Industrial Systems, IEEE Transactions on Industry Applications vol. 29, No. 2 (Mar. 1993).*

Kawaji, S., Stabilization of Unicycle Using Spinning Motion, *Denki Gakkai Ronbush*, vol. 107-D, Issue 1, Jan. 1987, pp. 21-28.

Schoonwinkel, A., *Design and Test of a Computer-Stabilized Unicycle*, Department of Aeronautics and Astronautics, Stanford University, Dec. 1987.

Vos, D., *Dynamics and Nonlinear Adaptive Control of an Autonomous Unicycle*, Massachusetts Institute of Technology, 1989.

Vos, D., *Nonlinear Control of an Autonomous Unicycle Robot: Practical Issues*, Massachusetts Institute of Technology, 1992.

Koyanagi et al., A Wheeled Inverse Pendulum Type Self-Contained Mobile Robot and its Posture Control and Vehicle Control, *The Society of Instrument and Control Engineers*, Special Issue of the 31st SICE Annual Conference, Japan, 1992, pp. 13-16.

Koyanagi et al., A Wheeled Inverse Pendulum Type Self-Contained Mobile Robot and its Two Dimensional Trajectory Control, *Proceeding of the Second International Symposium on Measurement and Control in Robotics*, Japan 1992, pp. 891-898.

Koyanagi et al., A Wheeled Inverse Pendulum Type Self-Contained Mobile Robot and its Posture Control and Vehicle Control, *The Society of Instrument and Control Engineers*, Special Issue of the 31st SICE Annual Conference, Japan, 1992, pp. 51-56.

Osaka et al., Stabilization of unicycle, *Systems and Control*, vol. 25, No. 3, Japan 1981, pp. 159-166.

Vos et al., Dynamics and Nonlinear Adaptive Control of an Autonomous Unicycle—Theory and Experiment, *American Institute of Aeronautics and Astronautics*, A90-26772 10-39, Washington, D.C. 1990, pp. 487-494. (abstract only).

Kanoh, Adaptive Control of Inverted Pendulum, *Computrol*, vol. 2, (1983), pp. 69-75.

Yamafuji, A Proposal for Modular-Structured Mobile Robots for Work that Principally Involve a Vehicle with Two Parallel Wheels, *Automation Technology*, vol. 20, pp. 113-118 (1998).

(56) References Cited

OTHER PUBLICATIONS

Yamafuji & Kawamura, Study of Postural and Driving Control of Coaxial Bicycle, *Paper Read at Meeting of Japan Society of Mechanical Engineering* (Series C), vol. 54, No. 501, (May 1998), pp. 1114-1121.

Yamafuji et al., Synchronization and Steering Control of Parallel Bicycle, *Paper Read at Meeting of Japan Society of Mechanical Engineering* (Series C), vol. 55, No. 513, (May 1989), pp. 1229-1234.

Momoi & Yamafuji, Motion Control of the Parallel Bicycle-Type Mobile Robot Composed of a Triple Inverted Pendulum, *Paper Read at Meeting of Japan Society of Mechanical Engineering* (Series C), vol. 57, No. 541, (Sep. 1991), pp. 154-159.

* cited by examiner

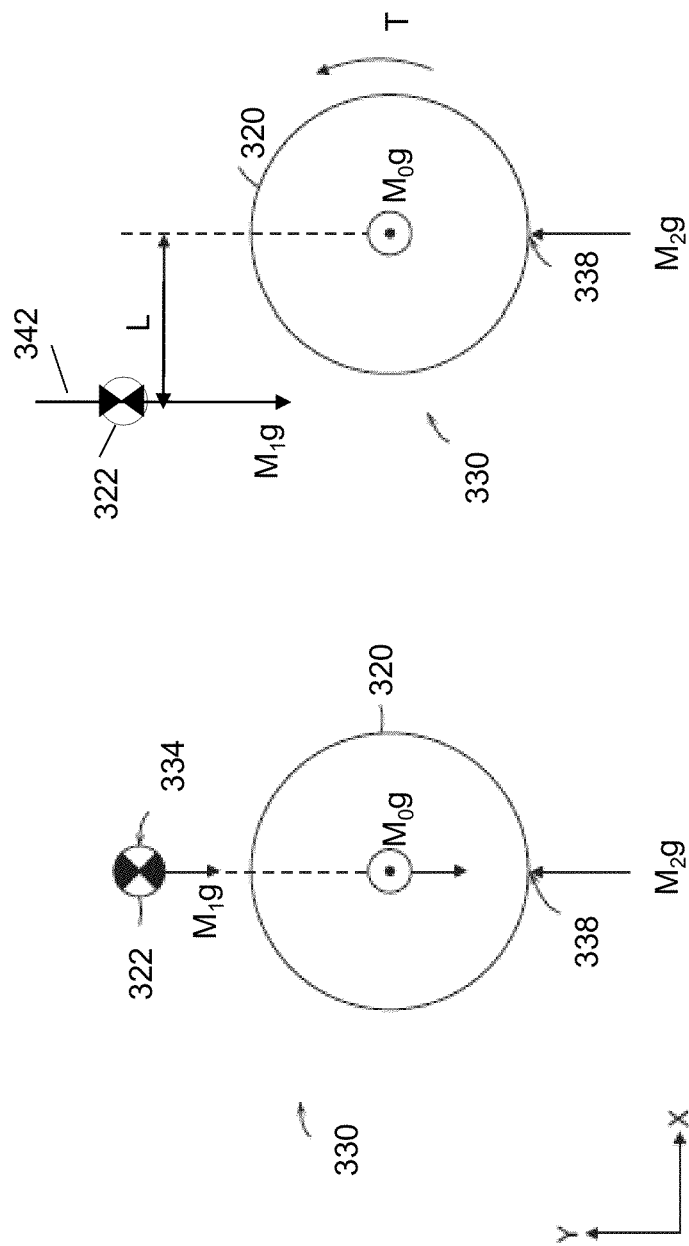

APPARATUS AND METHODS FOR CONTROL OF A VEHICLE

RELATED APPLICATIONS

The present application claims priority to U.S. Provisional Patent Application No. 61/308,659, filed Feb. 26, 2010, which is incorporated in its entirety herein by reference.

FIELD OF THE INVENTION

The present invention pertains to control of electric vehicles, and in particular, controlling electric vehicle motion.

BACKGROUND OF THE INVENTION

A wide range of vehicles and methods are known for transporting human subjects. Typically, such vehicles rely upon static stability and are designed for stability under all foreseen conditions of placement of their ground-contacting members with an underlying surface. For example, a gravity vector acting on the center of gravity of an automobile passes between the points of ground contact of the automobile's wheels and the suspension of the automobile keeps all wheels on the ground at all times making the automobile stable. Although, there are conditions (e.g., increase or decrease in speed, sharp turns and steep slopes) which cause otherwise stable vehicles to become unstable.

A dynamically stabilized vehicle, also known as a balancing vehicle, is a type of vehicle that has a control system that actively maintains the stability of the vehicle while the vehicle is operating. In a vehicle that has only two laterally-disposed wheels, for example, the control system maintains the fore-aft stability of the vehicle by continuously sensing the orientation of the vehicle, determining the corrective action necessary to maintain stability, and commanding the wheel motors to make the corrective action. If the vehicle losses the ability to maintain stability, such as through the failure of a component or a lack of sufficient power, the human subject can experience a sudden loss of balance.

For vehicles that maintain a stable footprint, coupling between steering control and control of the forward motion of the vehicles is less of a concern. Under typical road conditions, stability is maintained by virtue of the wheels being in contact with the ground throughout the course of a turn. In a balancing vehicle with two laterally disposed wheels, however, any torque applied to one or more wheels affects the stability of the vehicle.

SUMMARY OF THE INVENTION

The invention, in one aspect, features a method for controlling speed of a vehicle, the vehicle including a support, at least one wheel, a platform coupled to the at least one wheel, a coupling structure having a support portion coupled to the support and a platform portion coupled to the platform that allows the support portion to move or slide fore and aft with respect to the platform portion, an actuator coupled to the coupling structure to control the position of the support portion relative to the platform portion, a drive coupled to the at least one wheel to deliver power to the at least one wheel to propel the vehicle and maintain the platform at a desired orientation, and a controller coupled to the drive to control the drive and coupled to the actuator to control the actuator. The method includes determining position of the coupling structure support portion relative to the position of the coupling assembly platform portion and controlling torque applied by the at least one wheel to an underlying surface by commanding the coupling structure to vary the position of the support portion relative to the platform portion while maintaining the platform at the desired orientation.

In some embodiments, the method includes specifying a specific position of the support portion relative to the platform portion to control the torque applied by the at least one wheel to the underlying surface to achieve a desired speed for the vehicle. In some embodiments, the specific position is determined based on the vehicle operating mode. In some embodiments, the method includes receiving a vehicle speed command value from a user or controller and varying the position of the support portion relative to the platform portion to control the torque applied by the at least one wheel to the underlying surface to achieve the vehicle speed command value.

In some embodiments, the method includes receiving speed feedback signals from the at least one wheel, coupling structure speed, or both to command the coupling structure to vary the position of the support portion relative to the platform portion to control the torque applied by the at least one wheel to the underlying surface to control the speed of the vehicle. In some embodiments, the controller comprises a speed limiter module configured to constrain the size of a speed command signal to constrain the torque applied by the at least one wheel to the underlying surface to constrain the speed of the vehicle over a period of time in response to varying the position of the support portion relative to the platform portion over the period of time. In some embodiments, the coupling structure is a slide assembly, the support portion is a rail, and the platform portion is a rail guide. In some embodiments, the coupling structure is a four bar linkage.

The invention, in another aspect, features a vehicle that includes a support, at least one wheel and a platform coupled to the at least one wheel. The vehicle also includes a coupling structure having a support portion coupled to the support and a platform portion coupled to the platform that allows the support portion to move or slide fore and aft with respect to the platform portion. The vehicle also includes an actuator coupled to the coupling structure to control the position of the support portion relative to the platform portion, The vehicle also includes a drive coupled to the at least one wheel to deliver power to the at least one wheel to propel the vehicle and maintain the platform at a desired orientation. The vehicle also includes a controller coupled to the drive to control the drive and coupled to the actuator to control the actuator, wherein torque applied by the at least one wheel to an underlying surface vehicle is controlled by commanding the coupling structure to vary position of the support portion relative to the platform portion while maintaining the platform at the desired orientation.

In some embodiments, the controller is configured to command a specific position of the support portion relative to the platform portion to control the torque applied by the at least one wheel to the underlying surface to achieve a desired speed for the vehicle. In some embodiments, the vehicle includes an input device for receiving a vehicle speed command value from a user or controller and varying the position of the support portion relative to the platform portion to control the torque applied by the at least one wheel to the underlying surface to achieve the vehicle speed command value.

In some embodiments, the vehicle includes a wheel speed sensor and a coupling structure speed sensor to provide signals to the controller to command the coupling structure to vary the position of the support portion relative to the platform portion to control the torque applied by the at least one wheel to the underlying surface to control the speed of the vehicle. In some embodiments, the vehicle includes a speed limiter module configured to command the controller to constrain the size of a speed command signal to constrain the torque applied by the at least one wheel to the underlying surface to constrain the speed of the vehicle over a period of time in response to varying the position of the support portion relative to the platform portion over the period of time. In some embodiments, the coupling structure is a slide assembly, the support portion is a rail, and the platform portion is a rail guide. In some embodiments, the coupling structure is a four bar linkage.

The invention, in another aspect, features a method for maintaining a balancing margin for a dynamically-balancing vehicle. The vehicle includes a support, at least one wheel, a platform coupled to the at least one wheel, a coupling structure having a support portion coupled to the support and a platform portion coupled to the platform that allows the support portion to move or slide fore and aft with respect to the platform portion, an actuator coupled to the coupling structure to control the position of the support portion relative to the platform portion, a drive coupled to the at least one wheel to dynamically balance the vehicle and provide power to the at least one wheel to propel the vehicle, and a controller coupled to the drive to control the drive and coupled to the actuator to control the actuator. The method includes determining present operating wheel torque for the vehicle, determining present wheel torque capability of the vehicle, and controlling the coupling structure to control the position of the support portion relative to the platform portion based on the present operating wheel torque and the present wheel torque capability to maintain propulsion capability margins required for balancing the vehicle.

In some embodiments, the method includes enabling the coupling structure to only command positions that maintain balance of the vehicle. In some embodiments, the coupling structure is enabled to only command positions where the sum of the present operating wheel torque and torque required for balancing the vehicle demands a motor current level which is below estimated available drive motor current of a power source used to power operation of the vehicle. In some embodiments, the method includes controlling the speed of the vehicle based on commanded, measured or estimated fore/aft torque, yaw torque, or both. In some embodiments, the coupling structure is a slide assembly, the support portion is a rail, and the platform portion is a rail guide. In some embodiments, the coupling structure is a four bar linkage.

The invention, in another aspect, features a dynamically-balancing vehicle that includes a support, at least one wheel and a platform coupled to the at least one wheel. The vehicle also includes a coupling structure having a support portion coupled to the support and a platform portion coupled to the platform that allows the support portion to move or slide fore and aft with respect to the platform portion and an actuator coupled to the coupling structure to control the position of the support portion relative to the platform portion. The vehicle also includes a drive coupled to the at least one wheel to dynamically balance the vehicle and provide power to the at least one wheel to propel the vehicle. The vehicle also includes a controller coupled to the drive to control the drive and coupled to the actuator to control the actuator, wherein speed of the vehicle is controlled by commanding the coupling structure to control the position of the support portion relative to the platform portion based on present operating wheel torque for the vehicle and present wheel torque capability to maintain propulsion capability margins required for balancing the vehicle.

In some embodiments, the vehicle includes a position sensor to determine actual position of the support portion relative to the platform portion, wherein the controller compares position commands to the actual position and outputs actuator commands based on the comparison. In some embodiments, the vehicle includes an effort limiter module coupled to the controller to enable the coupling structure to only command positions that maintain balance of the vehicle. In some embodiments, the effort limiter is configured to only enable the coupling structure to command positions where the sum of the present operating wheel torque and the torque required for balancing the vehicle demands a motor current level which is below estimated available drive motor current of a power source used to power operation of the vehicle.

In some embodiments, the vehicle includes a user input for commanding fore/aft speed, yaw rate, or both, of the vehicle and the controller is configured to control the speed of the vehicle based on the commanded, measured or estimated fore/aft torque, yaw torque, or both. In some embodiments, the coupling structure is a slide assembly, the support portion is a rail, and the platform portion is a rail guide. In some embodiments, the coupling structure is a four bar linkage.

The invention, in another aspect, features a method for balancing a dynamically-balancing vehicle. The vehicle includes a support, at least one ground-contacting element, a platform coupled to the at least one ground-contacting element, a coupling structure having a support portion coupled to the support and a platform portion coupled to the platform that allows the support portion to move or slide fore and aft with respect to the platform portion, an actuator coupled to the coupling structure to control the position of the support portion relative to the platform portion, a drive coupled to the at least one ground-contacting element to dynamically balance the vehicle and deliver power to the at least one ground-contacting element to propel the vehicle, and a controller coupled to the drive to command the drive and coupled to the actuator to control the actuator. The method includes determining position of the coupling structure support portion relative to the coupling structure platform portion and controlling position of the coupling structure support portion relative to the coupling structure platform portion to move position of the vehicle center of gravity while dynamically balancing the vehicle.

In some embodiments, the method includes moving the support portion relative to the platform portion to dynamically balance the vehicle while the vehicle is at a commanded rest position relative to an underlying surface and the support is at least substantially level. In some embodiments, the method includes varying position of the support portion relative to the platform portion in response to a change in the position of the vehicle center of gravity. In some embodiments, the step of controlling position of the support portion relative to the platform portion is performed in response to vehicle fore/aft speed commands, yaw rate commands, or both, satisfying one or more predetermined conditions.

In some embodiments, the step of controlling position of the support portion relative to the platform portion is performed when the vehicle is operating in a predetermined mode of operation. In some embodiments, the method includes disabling the step of controlling position during vehicle takeoff and landing modes.

In some embodiments, the method includes enabling the step of controlling position after the vehicle enters a balancing mode from the takeoff mode. In some embodiments, the coupling structure is a slide assembly, the support portion is a rail, and the platform portion is a rail guide. In some embodiments, the coupling structure is a four bar linkage.

The invention, in another aspect, features a dynamically-balancing vehicle that includes a support, at least one ground-contacting element, and a platform coupled to the at least one ground-contacting element. The vehicle also includes a coupling structure having a support portion coupled to the support and a platform portion coupled to the platform that allows the support portion to move or slide fore and aft with respect to the platform portion. The vehicle also includes an actuator coupled to the coupling structure to control the position of the support portion relative to the platform portion and a drive coupled to the at least one ground-contacting element to dynamically balance the vehicle and provide power to the at least one ground-contacting element to propel the vehicle. The vehicle also includes a controller coupled to the drive to control the drive and coupled to the actuator to control the actuator, and wherein the controller balances the vehicle by determining position of the coupling structure support portion relative to the coupling structure platform portion and controlling position of the coupling structure support portion relative to the coupling structure platform portion to move position of the vehicle center of gravity while dynamically balancing the vehicle.

In some embodiments, the controller is configured to move the support portion relative to the platform portion to dynamically balance the vehicle while the vehicle is at a commanded rest position relative to an underlying surface and the support is at least substantially level. In some embodiments, the controller is configured to vary position of the support portion relative to the platform portion in response to a change in the position of the vehicle center of gravity. In some embodiments, controlling position of the support portion relative to the platform portion is performed in response to vehicle fore/aft speed commands, yaw rate commands, or both, satisfying one or more predetermined conditions. In some embodiments, controlling position of the support portion relative to the platform portion is performed when the vehicle is operating in a predetermined mode of operation.

In some embodiments, the controller is configured to disable the step of controlling position during vehicle takeoff and landing modes. In some embodiments, the controller is configured to enable the step of controlling position after the vehicle enters a balancing mode from the takeoff mode. In some embodiments, the coupling structure is a slide assembly, the support portion is a rail, and the platform portion is a rail guide. In some embodiments, the coupling structure is a four bar linkage.

The invention, in another aspect, features a method for determining motor current capability for a battery powered vehicle. The method includes estimating a sagged battery voltage for a vehicle battery during operation based on a) a predetermined maximum expected battery bus current of the vehicle battery during operation, b) an estimated battery open-circuit voltage, and c) an estimated battery open-circuit resistance. The method also includes estimating motor current capability for the battery powered vehicle based on d) operational speed of a motor used to propel the battery powered vehicle, e) back EMF constant of the motor, f) electrical resistance of the motor windings, g) the sagged battery voltage, h) electrical inductance of the motor windings, and i) magnetic pole pair count for the motor.

In some embodiments, the sagged battery voltage for a vehicle battery during operation is estimated in accordance with:

$$V_{bat\_sag} = V_{oc} - I_{bat\_max} * R_{bat},$$

where $V_{bat\_sag}$ is the estimated sagged battery voltage, $V_{oc}$ is estimated battery open-circuit voltage, $I_{bat\_max}$ is the predetermined maximum expected battery bus current, and $R_{bat}$ is the estimated battery open-circuit resistance.

In some embodiments, the motor current capability for the battery powered vehicle is estimated in accordance with:

$$I_{mot\_max}(Spd) = \frac{2}{\sqrt{3}} * \frac{-K_e * |Spd| * R_{mot} + \sqrt{V_{bat\_sag}^2 * [R_{mot}^2 + (PP*Spd*L_{mot})^2] - (K_e * Spd^2 * PP * L_{mot})^2}}{R_{mot}^2 + (PP*Spd*L_{mot})^2}$$

where $I_{mot\_max}$ is the motor current capability, Spd is the operating speed of the motor, $K_e$ is the line-to-line back EMF constant of the motor windings, $R_{mot}$ is the line-to-line resistance of the motor windings, PP is the magnetic pole pair count for the motor, and $L_{mot}$ is the line-to-line inductance of the motor windings.

In some embodiments, the method includes limiting the motor current capability for the battery powered vehicle based on a current limit of a motor drive for driving the motor in accordance with:

$$I_{mot\_cap}(Spd) = \min(I_{mot\_lim}, I_{mot\_max}(Spd))$$

where $I_{mot\_lim}$ is the current limit of the motor drive.

In some embodiments, the method includes limiting the value of the operating speed of the motor used to a maximum no-load speed of the motor based on $V_{bat\_sag}$ in accordance with:

$$Spd_{NoLoadEst} = \frac{V_{bat\_sag}}{K_e},$$

where $Spd_{NoLoadEst}$ is the maximum no-load speed.

The invention, in another aspect, features an apparatus for determining motor current capability for a battery powered vehicle. The apparatus includes a measurement module configured to measure operational speed of a motor used to propel the battery powered vehicle. The apparatus also includes an estimation module configured to estimate a sagged battery voltage for a vehicle battery during operation based on: a) a predetermined maximum expected battery bus current, b) an estimated battery open-circuit voltage, c) an estimated battery open-circuit resistance. The estimation module is also configured to estimate motor current capability for the battery powered vehicle based on: d) operational speed of a motor used to propel the battery powered vehicle, e) back EMF constant of the motor, f) electrical resistance of the motor windings, g) the sagged battery voltage, h) electrical inductance of the motor windings, and i) magnetic pole pair count for the motor.

The invention, in another aspect, features a method for estimating an electrical state of a battery providing power to an electrical load. The method includes a) acquiring values of the battery voltage and the battery current draw at a first point in time, b) monitoring battery voltage and battery current draw, and c) acquiring values of the battery voltage and battery current draw at a second point in time when the change in battery voltage between the first and second points in time is greater than a predetermined voltage amount and the change in battery current draw between the first and second points in time is greater than a predetermined current amount. The method also includes d) calculating battery resistance based on the change in battery voltage and battery current draw between the first and second points in time and e) calculating open-circuit battery voltage based on the calculated battery resistance, the battery current draw at the second point in time, and the battery voltage at the second point in time.

In some embodiments, the method includes repeating step b), f) acquiring values of the battery voltage and battery current draw at a third point in time when the change in battery voltage between the second and third points in time is greater than the predetermined voltage amount and the change in battery current draw between the second and third points in time is greater than the predetermined current amount, repeating step d), and repeating step e).

In some embodiments, the method includes repeating step b) and f) postponing acquiring values of the battery voltage and battery current draw at a third point in time until the change in battery voltage between the second and third points in time is greater than the predetermined voltage amount and the change in battery current draw between the second and third points in time is greater than the predetermined current amount.

In some embodiments, step e) includes determining whether a presently calculated battery resistance has changed by more than a predetermined percentage from a previously calculated battery resistance. In some embodiments, the method includes calculating open-circuit battery voltage based on the calculated battery resistance if the presently calculated battery resistance has not changed by more than a predetermined percentage relative to the previously calculated battery resistance. In some embodiments, the method includes calculating open-circuit battery voltage based on the previously calculated battery resistance if the presently calculated battery resistance has changed by more than a predetermined percentage relative to the previously calculated battery resistance.

In some embodiments, the method includes suspending steps c), d) and e) during predetermined operating conditions for a vehicle being power by the battery. In some embodiments, steps c), d) and e) are suspended when the vehicle is regeneratively braking for a predetermined period of time.

The invention, in another aspect, features an apparatus for estimating an electrical state of a battery providing power to an electrical load. The apparatus includes a measurement module configured to a) acquire values of the battery voltage and the battery current draw at a first point in time, b) monitor battery voltage and battery current draw, and c) acquire values of the battery voltage and battery current draw at a second point in time when the change in battery voltage between the first and second points in time is greater than a predetermined voltage amount and the change in battery current draw between the first and second points in time is greater than a predetermined current amount. The apparatus also includes an estimation module configured to d) calculate battery resistance based on the change in battery voltage and battery current draw between the first and second points in time and e) calculate open-circuit battery voltage based on the calculated battery resistance, the battery current draw at the second point in time, and the battery voltage at the second point in time.

In some embodiments, the measurement module is configured to repeat step b), f) acquire values of the battery voltage and battery current draw at a third point in time when the change in battery voltage between the second and third points in time is greater than the predetermined voltage amount and the change in battery current draw between the second and third points in time is greater than the predetermined current amount, repeat step d); and repeat step e).

In some embodiments, the measurement module is configured to repeat step b), and the estimation module is configured to f) postpone acquiring values of the battery voltage and battery current draw at a third point in time until the change in battery voltage between the second and third points in time is greater than the predetermined voltage amount and the change in battery current draw between the second and third points in time is greater than the predetermined current amount.

In some embodiments, the measurement module is configured to determine whether a presently calculated battery resistance has changed by more than a predetermined percentage from a previously calculated battery resistance. In some embodiments, the estimation module is configured to calculate open-circuit battery voltage based on the calculated battery resistance if the presently calculated battery resistance has not changed by more than a predetermined percentage relative to the previously calculated battery resistance.

In some embodiments, the estimation module is configured to calculate open-circuit battery voltage based on the previously calculated battery resistance if the calculated battery resistance has changed by more than a predetermined percentage relative to the previously calculated battery resistance. In some embodiments, the apparatus is configured to suspend steps c), d) and e) during predetermined operating conditions for a vehicle being power by the battery. In some embodiments, the apparatus is configured to suspend steps c), d) and e) when the vehicle is regeneratively braking for a predetermined period of time.

BRIEF DESCRIPTION OF THE DRAWINGS

The foregoing features of the invention will be more readily understood by reference to the following detailed description, taken with reference to the accompanying drawings, in which:

FIG. 3A is a block diagram of position of the center of gravity of a vehicle with respect to a ground-contacting element of the vehicle.

FIG. 3B is a block diagram of an alternative position of the center of gravity of the vehicle of FIG. 3A with respect to a ground-contacting element of the vehicle.

DETAILED DESCRIPTION OF ILLUSTRATIVE EMBODIMENTS

Figure 1:
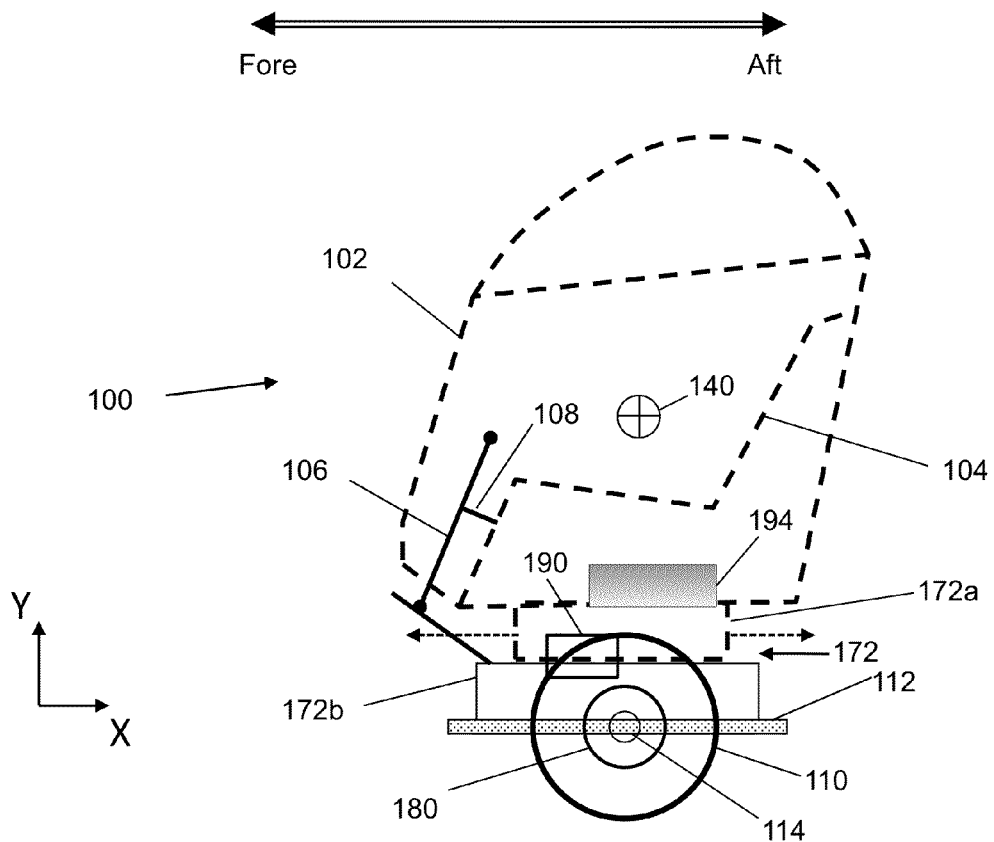
FIG. 1 is a schematic illustration of a vehicle, according to an illustrative embodiment of the invention.

FIG. 1 is a schematic illustration of a vehicle 100, according to an illustrative embodiment of the invention. The vehicle 100 includes an enclosure 102 coupled to a support 104. The vehicle 100 also includes at least one ground-contacting element 110 (e.g., one or more wheels) coupled to a platform 112. The ground-contacting element 110 rotates about an axle 114 which is coupled to the platform 112. The vehicle 100 also includes a coupling structure 172 that includes a support portion 172a coupled to the support 104 and a platform portion 172b coupled to the platform 112. The coupling structure 172 allows the support portion 172a to move or slide fore and aft with respect to the platform portion 172b.

In this embodiment, the coupling structure 172 is a slide assembly, and the support portion 172a is a rail and the platform portion 172b is a rail guide. In this embodiment, a human subject (not shown) manipulates an input device 106 to cause a position of a center of gravity 140 of the vehicle 100 to change. The input device 106 is coupled to a linkage 108. The linkage 108 is coupled to the support 104. The input device 106 can be, for example, a control stick, yoke, steering wheel or handlebar.

The human subject pushes the input device 106 forward (toward the negative X-Axis direction) which moves the enclosure 102 and support 104 forward (toward the negative X-Axis direction) relative to the ground-contacting element 110. The position of the center of gravity 140 of the vehicle 100 moves forward in response to the enclosure 102 and support 104 moving forward. A forward torque is generated by the ground-contacting element 110 in response to the center of gravity 140 of the vehicle 100 moving forward. The human subject pulls the input device 106 backward (toward the human subject's body and along the positive X-Axis direction) which moves the enclosure 102 and support 104 backward (toward the positive X-Axis direction) relative to the ground-contacting element 110. The position of the center of gravity 140 of the vehicle 100 moves backward in response to the enclosure 102 and support 104 moving backward. A negative torque is generated by the ground-contacting element 110 in response to the position of the center of gravity 140 of the vehicle 100 moving backward.

The vehicle 100 also includes an actuator 190 coupled to the coupling structure 172 to control the position of the support portion 172a relative to the platform portion 172b. The vehicle 100 also includes a drive 180 coupled to the platform 112 and the ground-contacting element 110. The drive 180 (e.g., a motorized drive) delivers power to the ground-contacting element 110 to cause rotation of the ground-contacting element 110 to propel/move the vehicle fore (towards the negative X-Axis direction) and aft (towards the positive X-Axis direction). The drive 180 also maintains the platform 112 at a desired orientation (e.g., level or a desired variation near level) with respect to gravity. In some embodiments, the vehicle 100 includes two or more laterally disposed (along the Z-axis, with the positive direction along the Z-axis out of the page) ground-contacting elements 110 which assist with providing lateral stability to the vehicle 100.

The vehicle 100 also includes at least one controller 194 (e.g., controller 400 of FIG. 4) coupled to the drive 180 to control the drive 180 and coupled to the actuator 190 to control the actuator 190. The controller 194 controls balancing of the vehicle 100 in response to the position of the enclosure 102 and support 104 relative to the ground-contacting element 110 and platform 112. A human subject (not shown) manipulates the input device 106 to command the drive 180 to command rotation of the ground-contacting element 110 to move the vehicle 100 in the fore and aft directions.

In some embodiments, when the enclosure 102, support 104 and support portion 172a slide forward or backward relative to the platform portion 172b, platform 112 and ground-contacting element 110, the enclosure 102, support 104 and support portion 172a remain at a desired orientation (e.g., level or desired variation near level) relative to the underlying surface/ground. In alternative embodiments, when the enclosure 102, support 104 and support portion 172a slide forward or backward relative to the platform portion 172b, platform 112 and ground-contacting element 110, the enclosure 102, support 104 and support portion 172a pitch relative to the ground. The vehicle 100 can be adapted such that enclosure 102, support 104 and support portion 172a pitch forward when the enclosure 102, support 104 and support portion 172a slide forward, or alternatively, adapted such that enclosure 102, support 104 and support portion 172a pitch backward when the enclosure 102, support 104 and support portion 172a slide forward.

In some embodiments, the human subject shifts his/her weight forward or backward to move the position of the center of gravity to cause the vehicle to move forward or backward, respectively, without causing the enclosure 102, support 104 and support portion 172a to move relative to the platform portion 172b, platform 112 and the ground-contacting element 110.

In some embodiments, the linkage 108 is coupled to a device that provides stiffness or damping to movement of the linkage 108 to, for example, enforce particular types of inputs to the vehicle and/or enhance the human subject's experience. In some embodiments, the device limits the speed that the linkage 108 is permitted to move which limits the speed at which the position of the center of gravity 140 is permitted to change and, therefore, limits the rate of change of the speed of the vehicle 100.

In some embodiments, the device damps oscillations in the movement of the linkage 108 to reduce oscillations in the pitch control loop and/or center of gravity control loop of a controller that controls operation of the vehicle 100. In the absence of the device, oscillations induced in the linkage 108 by, for example, a human subject pushing or pulling the input device 106 would result in oscillations in the pitch and/or speed of the vehicle 100.

In some embodiments, the support portion 172a and/or platform portion 172b includes a damper to prevent the speed of the vehicle 100 from oscillating when the support portion 172a moves out of phase with respect to the platform portion 172b due to, for example, an external disturbance or on-vehicle disturbance. For example, when the vehicle 100 travels over a bump, the support portion 172a may move or slide relative to the platform portion 172b, thereby moving the position of the center of gravity 140 of the vehicle 100 fore or aft. Movement of the position of the center of gravity 140 fore or aft causes the vehicle 100 to accelerate or decelerate. Therefore, a damper coupling the support portion 172a to the platform portion 172b would reduce the high frequency motion otherwise induced by the bump, and reduce the variation in the speed of the vehicle 100 due to the bump. The damper would not damp lower frequency motions introduced, for example, by a human subject pushing the input device to command a change to the position of the center of gravity 140 of the vehicle. In some embodiments, the damper is configured to damp high frequency oscillations or impulses. The damper can be a mechanical damper coupling the support portion 172a to the platform portion 172b. In some embodiments, the damper is a damping term implemented in the controller 194.

Figure 2A:
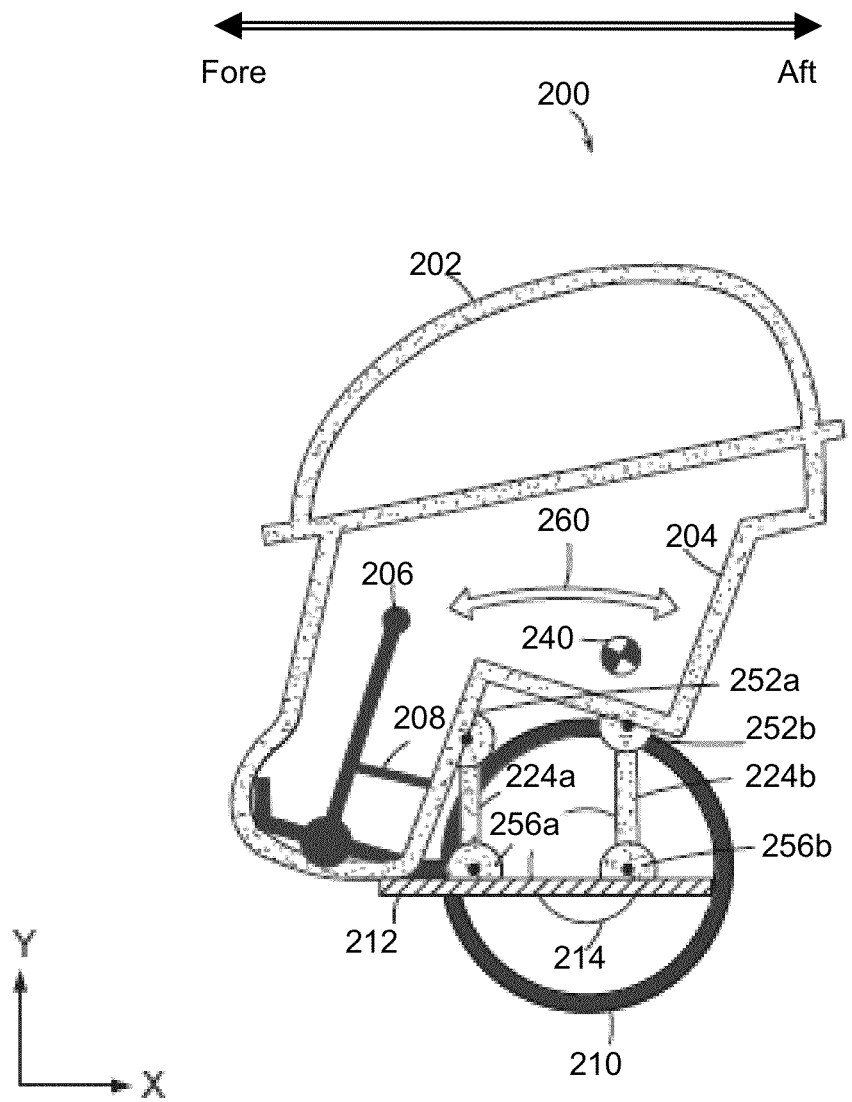
FIG. 2A is a schematic illustration of a vehicle, according to an illustrative embodiment of the invention.

FIG. 2A is a schematic illustration of a vehicle 200, according to an illustrative embodiment of the invention. The enclosure 202 is coupled to the support 204. The at least one ground-contacting element 210 is coupled to the platform 212. The ground-contacting element 210 rotates about the axle 214. The vehicle 200 also includes a coupling structure that is at least one four-bar linkage 224 (combination of first bar 224a and second bar 224b). A first end 252a of the first bar 224a is coupled to the support 204 and a first end 252b of the second bar 224b is coupled to the support 204. First end 252a and first end 252b of the bars are the support portion of the coupling structure. A second end 256a of the first bar 224a is coupled to the platform 212 and a second end 256b of the second bar 224b is coupled to the platform 212. Second end 256a and second end 256b of the bars are the platform portion of the coupling structure.

The enclosure 202 and support 204 move along a path 260 defined by a rotation of the four-bar linkage 224 in the X-Y plane. In this embodiment, a human subject (not shown) manipulates an input device 206 to cause the position of the center of gravity 240 of the vehicle 200 to change. The input device 206 is coupled to the linkage 208. The linkage 208 is coupled to the support 204. The human subject pushes the input device 206 forward (toward the negative X-Axis direction) which moves the enclosure 202 and support 204 along the path 260 defined by the rotation of the four-bar linkage 224, moving the enclosure 202 and support 204 forward (toward the negative X-Axis direction) relative to the ground-contacting element 210. The position of the center of gravity 240 of the vehicle 200 moves forward in response to the enclosure 202 and support 204 moving forward. A forward torque is generated by the ground-contacting element 210 in response to the position of the center of gravity 240 of the vehicle 200 moving forward.

The human subject pulls the input device 206 backward (toward the human subject's body and along the positive X-Axis direction) which moves the enclosure 202 and support 204 along the path 260 defined by the rotation of the four-bar linkage 224, moving the enclosure 202 and support 204 backward (toward the positive X-Axis direction) relative to the ground-contacting element 210. The position of the center of gravity 240 of the vehicle 200 moves backward in response to the enclosure 202 and support 204 moving backward. A negative torque is generated by the ground-contacting element 210 in response to the position of the center of gravity 240 of the vehicle 200 moving backward.

In some embodiments, the vehicle 200 includes two laterally disposed ground-contacting elements. The vehicle also includes two four-bar linkages (e.g., two of the four-bar linkages 224). Each four-bar linkage is coupled to one of the two laterally disposed ground-contacting elements. In some embodiments, one or more four-bar linkages are flexible bars. The flexible bars bend to permit, for example, the enclosure and support to move along a path (e.g., the path 260 of FIG. 2A).

Figure 2B:
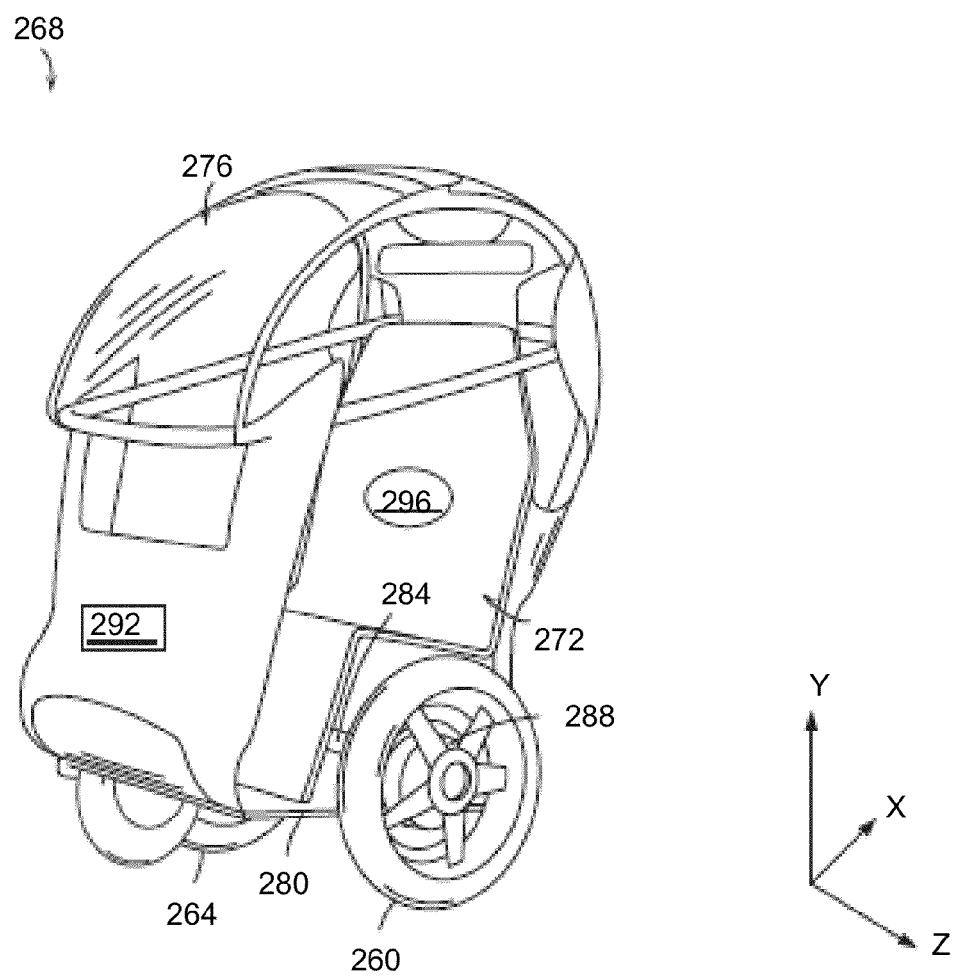
FIG. 2B is a schematic illustration of a vehicle, according to an illustrative embodiment of the invention.

FIG. 2B is a three-dimensional view of a vehicle 268, according to an illustrative embodiment of the invention. A human subject (not shown) rests on a support 272 in an enclosure 276 that at least partially encloses the human subject. The vehicle 268 includes two wheels 260, 264. The two wheels 260, 264 are coupled to a platform 280. Wheel 260 is laterally disposed to wheel 264. The wheels each rotate about an axle 284 and are powered by at least one drive 288 (e.g., a motorized drive). A controller (292) is coupled to the drive 288 for providing a control signal in response to changes in vehicle orientation (e.g., pitch) and position of the center of gravity 296 of the vehicle 268.

As the human subject mounts the vehicle 268, the controller 292 implements a control loop and senses a change in the vehicle's 268 orientation that can result from a change in the position of the center of gravity 296 in a fore-aft plane and controls power provided to the wheels 260, 264 based upon the change to the position of the center of gravity 296. In response to the change in the vehicle's 268 orientation and changes in the position of the center of gravity 296, torque is applied to the wheels 260, 264 to dynamically stabilize the vehicle 268, similarly as described in U.S. patent application Ser. No. 12/266.170 (the entire contents of which are hereby incorporated by reference in its entirety).

In one embodiment, as the position of the center of gravity 296 moves in a fore direction (toward the negative X-Axis direction), the drive 288 provides power to the two wheels 260, 264 sufficient to cause the vehicle 268 to move forward (toward the negative X-Axis direction). As the center of gravity 296 moves in the aft direction (toward the positive X-Axis direction), the drive 288 provides power to the two wheels 260, 264 sufficient to cause the vehicle 268 to slow and reverse direction such that the vehicle 268 moves backward (toward the positive X-Axis direction).

The pitch of the vehicle 268 (angular orientation of the vehicle 268 about the axle 284) may also be sensed and compensated for in the control loop. The controller includes gyroscopes for sensing orientation of the vehicle 268 that can result from changes in the position of the center of gravity 296.

Vehicle 268 pitch variation is decreased during operation when the vehicle 268 is dynamically stabilized based on the change in the position of the support portion relative to the platform portion (e.g., support portion 172a and platform portion 172b of FIG. 1) rather than in response to a change in pitch. It also shortens the time it takes the vehicle 268 to respond to an acceleration and/or deceleration command. The vehicle 268 accelerates and/or decelerates by restoring the position of the center of gravity 296 of the vehicle 268 over the location that the wheels 260 and 264 contact the ground. If the vehicle 268 was accelerated and/or decelerated in response to a change in pitch, a controller of the vehicle 268 would first need to induce a change in the position of the center of gravity 296 relative to a steady state position and then command the drive 288 to operate the wheels 260 and 264 in such a manner as to position the center of gravity 296 above the location where the ground-contacting elements contact the ground. The time required to induce a change in the position of the center of gravity 296 back to the steady state position is a time delay for the vehicle 268 to respond to an acceleration and/or deceleration command compared to acceleration and/or deceleration in response to a change in the position of the center of gravity. The vehicle 268 does not need to induce the change in the position of the center of gravity 296 from a steady state because the change of the position of the center of gravity 296 is inherent in the acceleration and/or deceleration command. The acceleration and/or deceleration command necessitates a change in the orientation of the vehicle 268 to position the center of gravity 296 in the correct position so that acceleration and/or deceleration can begin.

Figure 3:
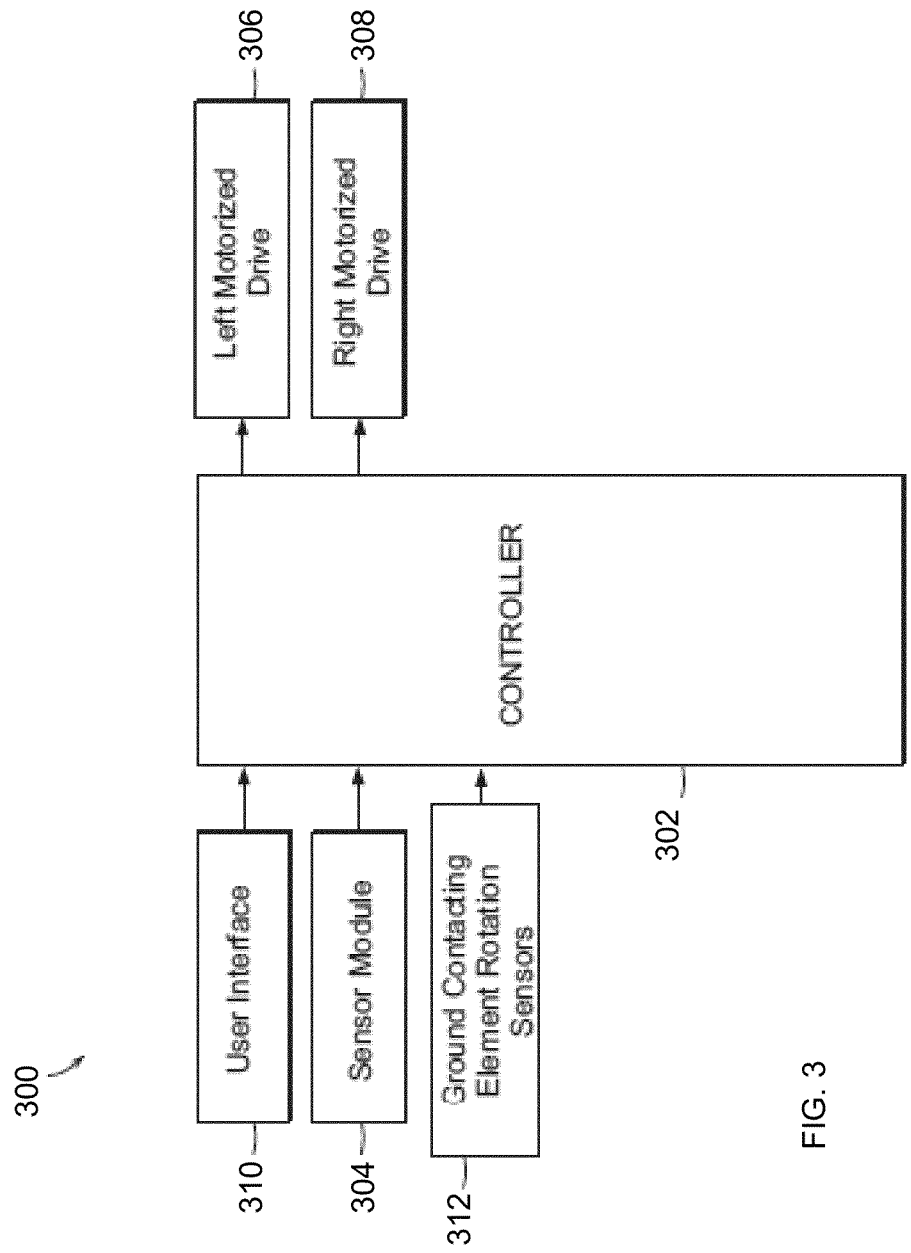
FIG. 3 is a block diagram of a control system for dynamically controlling the stability of a vehicle, according to an illustrative embodiment of the invention.

FIG. 3 is a block diagram of a control system 300 for dynamically controlling the stability of a vehicle having two laterally disposed wheels (e.g., wheels 260 and 264 of FIG. 2B), according to an illustrative embodiment of the invention. A controller 302 (e.g., controller 400 of FIG. 4) receives an input characteristic of a position of the support portion (e.g., support portion 172a of FIG. 1) relative to the platform portion (e.g., platform portion 172b of FIG. 1) which affects the location of the center of gravity of the vehicle, from a sensor module 304. Based on at least the position of the support portion relative to the platform portion provided by the sensor module 304, the controller 302 commands torque T of at least one of the left motorized drive 306 or right motorized drive 308 (e.g., torque applied to the corresponding ground-contacting elements).

FIGS. 3A and 3B are block diagrams that illustrate the effect of the position of the center of gravity 322 of a vehicle 330 on operation of the vehicle 330, according to an illustrative embodiment of the invention. The vehicle 330 has a total mass $M_2$ (weight of $M_2g$). The mass of a payload and a portion of the vehicle 330 is denoted as $M_1$ (weight of $M_1g$) which corresponds to the mass of the center of gravity 322. The mass of two laterally disposed contacting elements 320 is denoted as mass $M_0$ (weight of $M_0g$). The weight of the vehicle 330 is expressed as:

$$M_2g = M_1g + M_0g \qquad \text{EQN. 1}$$

The portion of the vehicle 330 capable of moving along the X-Axis direction relative to the position of the ground-contacting elements 320 is represented by the center of gravity 322. Referring to FIG. 3A, the center of gravity 322 is located at an initial location 334 above the location 338 where the ground-contacting elements 320 contact the ground.

Referring to FIG. 3B, the center of gravity 322 is located at a location 342, at a distance L along the negative X-Axis direction relative to the initial location 334. In one embodiment, the center of gravity 322 is positioned at location 342 by a human subject moving the position of the center of gravity of the vehicle 330. The sensor module 304 (of FIG. 3) provides the pitch of the vehicle 330 and the orientation of the vehicle 330 to the controller 302. The pitch and orientation change as the position 342 of the center of gravity 322 changes. The controller 302 outputs a signal to the left motorized drive 306 and right motorized drive 308 to apply a torque $[T=(M_1g)(L)]$ to the ground-contacting elements 320 to cause the ground-contacting elements 320 to move in the direction (e.g., forward along the negative X-Axis direction) the center of gravity 322 has been displaced from the previous location 338 to maintain balance of the vehicle 330.

The masses of the vehicle 330 can be advantageously distributed between the payload and related structure (collectively 322) and the ground contacting-elements and related structure (collectively 320) to maximize acceleration and deceleration performance. In one embodiment, it is advantageous to locate a larger percentage of the total vehicle 330 mass with the moving portion of the vehicle 330 (i.e., with the payload and related structure 322) to maximize acceleration and deceleration performance. Placing more of the total vehicle 330 mass with the moving portion 322 enables the larger amount of mass to contribute to generating the motor commands required to accelerate or decelerate the vehicle 330. If, however, more of the total vehicle 330 mass was placed with the ground-contacting elements and related structure 320, the larger percentage of mass would be a load that the vehicle 330 needs to move as part of the entire vehicle 330.

The controller 302 also interfaces with a user interface 310 and a wheel rotation sensor 312. The user interface 310 can, for example, include controls for turning the vehicle on or off, or for triggering different operating modes of the vehicle.

The sensor module 304 detects one or more vehicle parameters to determine a change in the position of the center of gravity of the vehicle (e.g., due to movement of the support portion 172a relative to the platform portion 172b of the vehicle 100 of FIG. 1). In one embodiment, the sensor module 304 generates a signal indicative of a change in the position of the center of gravity at one instance in time with respect to the position of the center of gravity at another instance in time. For example, a distance sensor attached to a spring, a load sensor, an inclinometer, a gyroscope, whiskers and/or an angular rate sensor can be used to determine a change in the center of gravity of the vehicle. Other sensors (e.g., optical sensors and/or magnetic sensors) can also be employed and are therefore within the scope of the present invention.

The controller 302 includes a control algorithm to determine the amount of torque to be applied by the left motorized drive 306 and/or right motorized drive 308 based on the slide position (support portion relative to the platform portion). The control algorithm can be configured, for example, during the design of the vehicle or in real time, on the basis of a current operating mode of the vehicle, operating conditions experience by the vehicle, as well as preferences of a human subject.

As an example, not meant to be limiting, the control algorithm can take the form:

$$\text{Torque Command} = K \cdot (C + O) \qquad \text{EQN. 2}$$

where K is the gain, C is a vector defining the position of the center of gravity of the vehicle, and O is an offset. The position of the center of gravity, C, can be in the form of an error term defined as the desired position of the slide (support portion relative to the platform portion) minus the sensed position of the slide. Changing the slide position may be the method used to affect the position of the CG. The desired position of the slide can be for example, a predetermined constant in the control algorithm. Alternatively, a human subject in the vehicle can set the position of the slide via a user interface. In this embodiment, upon starting the vehicle and prior to allowing movement of the vehicle, a human subject can activate a switch on the vehicle that triggers determination of the desired position of the slide based on inputs received from the sensor module. This allows the human subject to acquire a known initial position of the slide, from which the human subject can then deviate so as to cause a change in the position of the slide (causing a change in position of the CG).

The gain, K, can be a predetermined constant, or can be entered or adjusted by the human subject through the user interface 310. Gain K is, most generally, a vector, with the torque determined as a scalar product of the gain and the position of the slide displacement vector. Responsiveness of the vehicle to changes in the position of the slide can be governed by K. For example, increasing the magnitude of at least one element of vector K causes a human subject to perceive a stiffer response in that a small change in the position of the slide results in a large torque command.

Offset, O, can be incorporated into the control algorithm to govern the torque applied to the left motorized drive 306 and right motorized drives 308, either in addition to, or separate from, the direct effect of C. Thus, for example, the human subject can provide an input by means of the user interface 310 (e.g., input 106 of FIG. 1), the input is treated by the controller 302 equivalently to a change, for example, in the position of the slide.

In one embodiment, steering can be accomplished by calculating the torque desired for the left motorized drive 306 and the torque desired for the right motorized drive 308 separately. Additionally, tracking both the left wheel motion and the right wheel motion permits adjustments to be made, as known to persons of ordinary skill in the control arts, to prevent unwanted turning of the vehicle and to account for performance variations between the left motorized drive 306 and the right motorized drive 308.

Steering may be accomplished in an embodiment having at least two laterally disposed ground-contacting elements (e.g., a left and right wheel), by providing, for example, separate motors for left and right ground-contacting elements. Torque desired for the left motor and the torque desired for the right motor can be calculated separately. Additionally, tracking both the left ground-contacting element motion and the right ground-contacting element motion with the ground-contacting element rotation sensors 312 permits adjustments to be made, as known to persons of ordinary skill in the control arts, to prevent unwanted turning of the vehicle and to account for performance variations between the two motors. In some embodiments, steering sensitivity is adjusted to a higher sensitivity when a vehicle is at lower speeds and lower sensitivity when a vehicle is at higher speeds to allow, for example, easier steering at higher speeds.

In some embodiments, the control system 300 limits the speed of the vehicle. The speed limit can be set based on, for example, a maximum speed associated with the operating mode of the vehicle or an input from the human subject.

In one embodiment, the control system 300 includes a speed limiting algorithm that regulates the speed of the vehicle by controlling the pitch of the vehicle. The controller 302 changes the pitch of the vehicle which moves the position of the center of gravity. Changes in the position of the center of gravity cause the vehicle to accelerate or decelerate depending on which direction the center of gravity is moved. The speed limiting algorithm causes the controller 302 limit the speed of the vehicle by adjusting a desired pitch angle $\Theta_D$. The pitch control loop of the system 300 controls the system 300 to achieve the desired pitch angle $\Theta_D$.

The adjustment of the desired pitch angle $\theta_D$ is determined based on the following relationship:

$$\Theta_D = K1 * \left[ \frac{\overbrace{K2*(V_{SpeedLimit} - V_{cm})}^{A} +}{\underbrace{K3*(IntegratedSpeedError)}_{B} + \underbrace{K4*(Acceleration)}_{C}} \right] \quad \text{EQN. 3}$$

where $V_{SpeedLimit}$ is the current maximum allowed speed of the vehicle, $V_{cm}$ is the speed of the vehicle, K2 is a gain proportional to the difference between the vehicle's speed limit and the vehicle's actual speed, K3 is a gain on the Integrated Speed Error, which is the integrated difference between the vehicle's speed limit and the vehicle's actual speed, K4 is a gain on the acceleration of the vehicle, K1 is a gain on the overall calculated desired pitch that can be a function of, for example, a position of the center of gravity of the vehicle, and $\theta_D$ is the desired pitch angle. The cumulative effect of terms A, B and C in EQN. 3 is to cause the vehicle to pitch backward into a deceleration orientation if the forward speed limit is exceeded. The value of the desired pitch angle, $\theta_D$ is varied in the control system 300 to control the speed of the vehicle.

In one embodiment, the desired pitch angle $\theta_D$ remains constant (e.g., the vehicle remains level with respect to the ground plane). When a predefined maximum speed limit is reached, the control system 300 responds by setting the desired pitch angle $\theta_D$ to a value to decelerate the vehicle to prevent the vehicle from exceeding the maximum speed limit. This has the effect of the control system 300 commanding the vehicle to pitch backwards which causes the speed of the vehicle to decrease.

In some embodiments, the control system 300 is configured to account for the human subject commanding the vehicle to slow down. When the control system 300 determines that the human subject has caused the position of the center of gravity to shift rearward, the controller reduces the value of the gain K1. By reducing the value of the gain K1, the pitch angle terms in the control system 300 (governed by, for example, EQN. 3) are de-emphasized. Because the control system 300 de-emphasizes the pitch angle terms, the control system 300 does not command the vehicle to pitch backwards as much as it would in the absence of the human subject commanding the vehicle to slow down.

Figure 4:
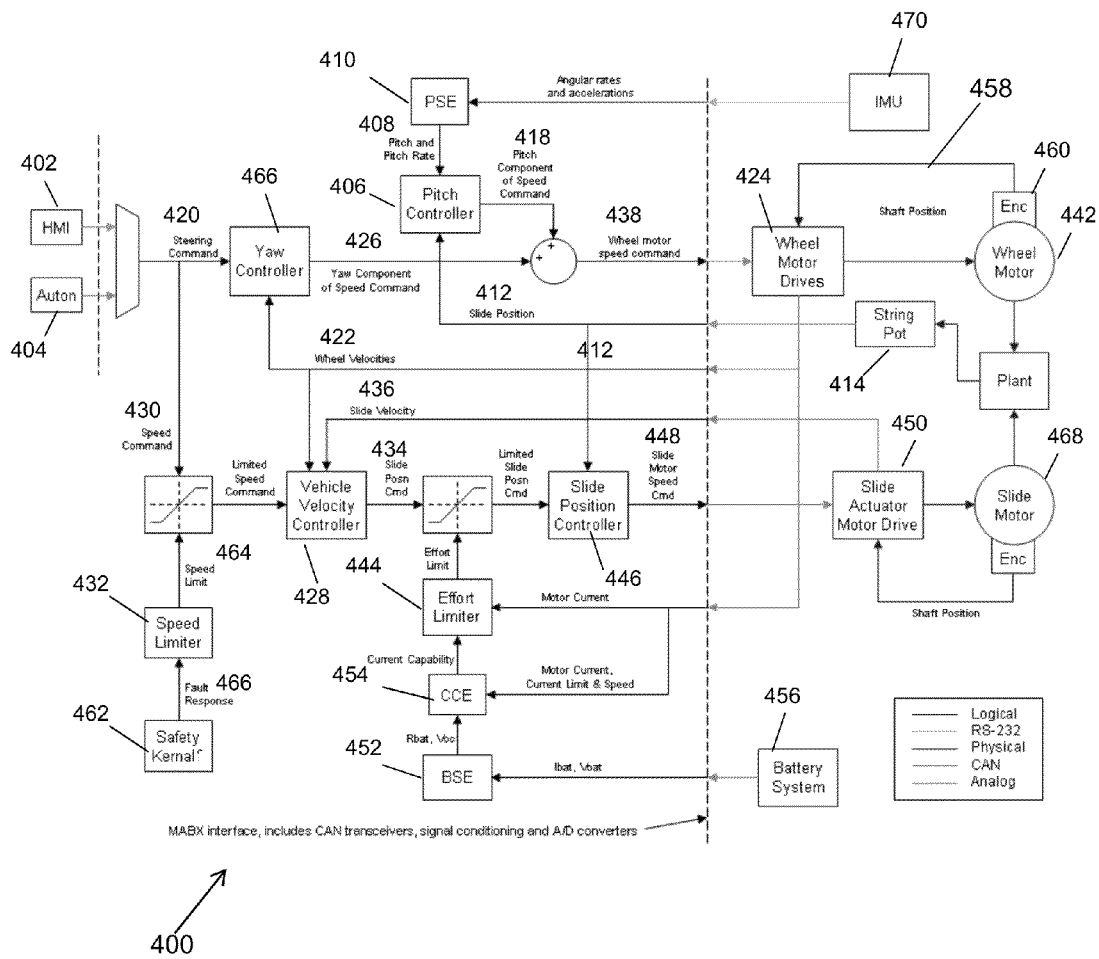
FIG. 4 is a block diagram of a controller for controlling the operation of a vehicle, according to an illustrative embodiment of the invention.

FIG. 4 is a block diagram of a controller 400 for controlling the operation of a vehicle (e.g., vehicle 100 of FIG. 1), according to an illustrative embodiment of the invention. The vehicle's dynamic response to a rider's 402 or a controller's 404 (e.g., autonomous) input commands, terrain, payload, wind load, and system capability can be managed by a number of nested and cooperative closed-loop system controllers. The pitch controller 406 maintains dynamic stability of the vehicle. The pitch controller 406 can take feedback data from various sources, for example, pitch and pitch rate 408 from the pitch state estimator (PSE) 410, and slide position 412 from slide-mounted string potentiometer 414 (or, an other suitable sensor that provides a measure of the position of, for example, the support portion of the coupling structure relative to the platform portion of the coupling structure). The pitch controller 416 can output wheel motor speed commands 418 to keep the vehicle chassis (e.g., support) level.

The vehicle's yaw controller 466 can take, as input, steering commands from the HMI 402 (or the controller 404) and compare the steering commands 420 to the wheels speeds 422 from the wheel motor drives 424 to create wheel motor speed command components 426 needed to steer and turn the vehicle. The wheel motor speed commands 438 can include a command component for the vehicle's propulsion and a command component for the vehicle's steering. In some embodiments, the steering command component 426 is added to the propulsion command component 418 (from the pitch controller 406) for one wheel and subtracted from the propulsion component 418 for the other wheel.

The vehicle's velocity controller 428 can take, as input, vehicle speed commands 430 from the HMI 402 (or the controller 404), that have, if necessary, been limited by the vehicle's speed limiter 432. The vehicle's velocity controller 428 can create slide position commands 434 to adjust the position of the slide affecting the position of the CG and thus, adjust torque applied by the wheels to an underlying surface to adjust the acceleration and speed of the vehicle. The vehicle's velocity controller 428 can receive velocity feedback from both the wheel 422 and the slide 436 motor drives.

Wheel speed command components 418 and 426 can be output from the pitch 406 and yaw 446 controllers and can be combined to create overall motor speed commands 438 that the vehicle can use to balance, steer and drive the vehicle. The resulting wheel speed commands 438 can be sent to wheel motor drives 424 which can control the speeds of the wheel motors 442. The wheel motor drives 424 can be digitally controlled, sine modulated, and permanent magnet motor drives.

A slide position command 434 can be output from the vehicle's velocity controller 428, which may be limited by the effort limiter 444, can be input to a slide position controller 446. The slide position controller 446 compares the slide position command 434 to the actual slide position 412 from the string potentiometer and outputs slide motor speed command 448. The motor speed command 448 can be input to slide actuator motor drive 450 which can control the slide's motor 468 speed.

Inside the vehicle's wheel motor drives 424, there can be motor speed loops to control motor current loops which can control duty cycles of power bridges that can output varying 3-phase voltages to the vehicle's wheel motors 442. The vehicle's wheel motor positions 458 can be fed back to the wheel motor drives 424 from motor shaft encoders 460 for commutation and for closing the speed loop. The speed controllers can be configured with proportional gains. Thus, a steady-state speed error can develop under a load. The presence of a steady-state speed error can help ensure that loads carried by redundant motors, if implemented, are shared in a reasonably well-balanced fashion. A current limiter in each wheel motor drive 424 can protect the motor drives 424 and their motors 442 from overheating while allowing peak torque capability for short durations and continuous torque capability for indefinite periods of operation.

In order to know how much to limit the effort demanded of the propulsion system, the wheel motor current capability can be estimated. The motor current capability can be estimated by knowing the present motor speed, current and current limits, which can be fed back from the wheel motor drives 424, and the estimated battery resistance and open-circuit voltage from the battery state estimator (BSE) 452. Thus, the BSE 452 can use the current and terminal voltage fed back from the battery 456 to estimate the battery resistance by monitoring how much the battery voltage changes in response to battery current changes. The BSE 452 can estimate the open-circuit battery voltage (the no-load voltage) from the actual battery current and terminal voltage and the battery's estimated resistance. Mechanisms and methods for battery state estimation are described herein.

Using as inputs the battery state estimates from the BSE 452, and the motor current, current limit and speed feedback from the wheel motor drives 424, the motor current capability estimator (CCE) 454 can estimate the motor current that the vehicle's propulsion system can produce at any point in time. Methods and mechanisms for current capability estimation (CCE) are described herein. The current capability can be passed to the effort limiter 444, which limits the slide position to keep a margin between the commanded current and the current capability of the system, thus balancing and steering capability can be maintained. The vehicle's motor drives 424 can include current limiting algorithms to adjust the vehicle's motor current between peak and continuous limits. The limits are selected to protect both the motors 442 and the drives 424. Any time the commanded or target current is above a drive's continuous limit, the drive's enforced limit can slew down to the drive's continuous limit. When the motor target current drops below the continuous limit, the enforced limit can slew back up to the peak limit. The enforced limits can be fed back from the drives 424 to the CCE 454.

The vehicle's speed limiter 432 can set the top speed limit of the system and implement a slowdown response that can be requested by the vehicle's safety kernel 462. Thus, the speed limiter 432 can pass a speed limit value 464 to the vehicle's velocity controller 428, which enforces it. As the safety kernel 462 determines that a slowdown response is needed, it can request a slowdown response from the speed limiter 432. The speed limiter 432 can calculate a time-varying speed limit that can be used for the slowdown response and pass the time-varying speed values to the velocity controller 428.

There are several responses to hazards and faults 466 that the safety kernel 462 can issue that can result in changing the speed limit. For example, limit-speed response, zero-speed response, full-system safety shutdown, and half-system safety shutdown (for redundant systems). They are similar in the fact that they can all cause the system to decelerate; and differ on the values they can limit to and the rates they can cause the system to decelerate at. Additionally, safety shutdown responses can be coupled with landing (transitioning to a statically-stable state) and power down commands once the system has reached zero speed.

The vehicle's limit-speed response can be issued under transient conditions such as when an Inertial Measurement Unit (IMU) 470 is "dizzy". Once the transient condition disappears (e.g., no longer turning fast) the limit on speed can be slowly lifted. The zero-speed response can be issued, for example, if the conditions causing the limit-speed response persist, and the system can set the speed limit to zero fairly rapidly.

The safety shutdown responses can be issued when the system has encountered a fault that requires the system to come to rest and power down. A safety shutdown brings the system to zero speed. The rate at which the system is brought to zero speed can vary with the type of safety shutdown. In cases where the full system is available, the system can decelerate at the maximum possible rate to minimize the time the system remains on while faulted. For redundant systems in the half-system case, the slowdown rate can be cut in half because the system only has half capability and trying to decelerate at maximum full system rates can increase the likelihood of saturating the half-system capability. The speed limiter 432 can inform the safety kernel 462 when it has achieved its task, but sometimes can delay the feedback to ensure, for example, that the system dynamics have settled before issuing land and power-down commands.

The pitch controller 406 can use estimated feedback data for pitch and pitch rate 408. These estimates can be calculated in the Pitch State Estimator (PSE) 410 from raw angular rate and accelerometer data from the IMU 470.

The pitch controller 406 can be a closed-loop controller and can be the primary balancing function. The pitch controller 406 has as inputs information about the desired and measured pitch orientations of the vehicle with respect to gravity and can create commands for the actuators to provide stabilizing forces. These forces, while providing stability in the pitch axis, concurrently provide a propulsive force for the general fore/aft motion of the vehicle. The output 418 of the pitch controller 406 is a component of the overall propulsion command and can be added to the other components in another module.

The pitch controller 406 can include four terms, the sum of which can constitute the pitch command. The first term can be a gain applied to the difference between the desired and measured/estimated pitch, also known as the "error." The product of the gain and the error is commonly referred to as a "proportional term." When applied to the balancing vehicle, the proportional term drives the vehicle in the direction of the vehicle pitch or "lean." An additional degree of freedom represented by the linear slide actuator can require compensation in the first term of the pitch controller. A pitch offset can be applied as a function of the slide position. The pitch offset term offsets a desired pitch by a current slide position multiplied by an empirically-derived gain. This can be done to compensate for the increasing torque demand on the wheel actuator as the distance to the overhung load is increased in magnitude. The distance to the overhung load is calculated as the fore/aft distance from the neutral balance point (not from the center of slide travel). The second term can be a gain applied to the pitch rate data. This term is commonly referred to as a "rate term." A rate term opposes pitch motion, and thus can resist changes in orientation. It can be a source of damping in the controller.

The third term can be for a motor drive that controls speed or voltage. It can be a "feed-forward term" based on average speed of the left and right wheel motors. This term can be used to provide some steady state command for a given vehicle speed so as to reduce the need for pitch error to grow as speed increases. This term can be unnecessary for the pitch controller when directly commanding motor current. The fourth term can be for slide motion compensation. As the slide moves it imparts disturbance forces on the system. This term can be a "feed-forward term" based on slide motion. The term can be used to provide some damping when there is relative motion between the support portion of the coupling structure of the vehicle relative to the platform portion of the coupling structure of the vehicle. It can perform the function of adding damping when the pitch loop is excited by any relative motion between the support portion relative to the platform portion.

Speed Control

Figure 5:
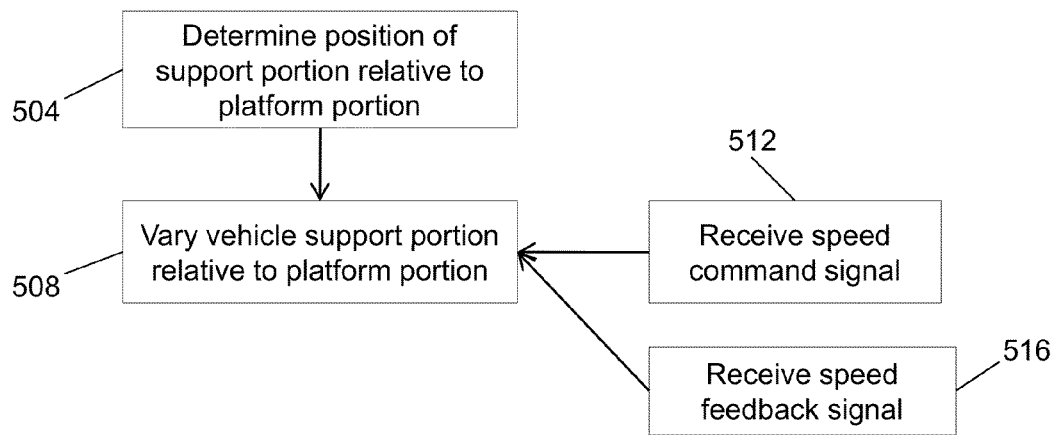
FIG. 5 is a flowchart of a method for controlling vehicle velocity, according to an illustrative embodiment of the invention.

FIG. 5 is a flowchart of a method for controlling vehicle velocity, according to an illustrative embodiment of the invention. In one embodiment, the method is implemented using a velocity controller (referring to the vehicle velocity controller 428 of FIG. 4 used to control operating speed of vehicle 100 of FIG. 1). The velocity controller is a closed-loop controller that regulates the fore/aft motion of the vehicle. It accomplishes this through the combined effects of controlling the slide controller 446 and the pitch controller 406. The velocity controller 428 calculates a desired position for the slide which the slide position controller carries out. The resulting shift in the position of the center of gravity (CG) in turn can induce motion by causing pitch error, and thus wheel motion can be driven by the pitch controller.

The velocity controller 428 can be a high-level controller that can utilize lower-level controllers directly (slide) and indirectly (pitch) to control the plant. The output of the velocity controller can be a desired slide position that feeds the slide controller. By positioning the enclosure 102, support 104, and support portion 172a of the coupling structure 172 and battery mass relative to the wheels 110, the velocity controller 428 can induce commands in the pitch loop which in turn can give rise to vehicle accelerations which the velocity controller can utilize to achieve its goal.

The target of the velocity loop can be calculated from one of two sources, either the manual controls 402 or the controller 404. The velocity controller 428 is capable of switching between these two sources while the loop is closing to achieve the operational goals of the system, including mode switching on the fly. The velocity controller 428 can have a proportional term and an integral term. The integral term can be important for several reasons. It can provide the system with its station-keeping capability on flat ground, inclined surfaces, in the presence of external disturbances (e.g., wind) and compensate for the variation in system losses that occur over the working speed range to effectively achieve the target.

The velocity controller 428 feedback is a combination of wheel velocity 422 and slide velocity 436. This can be important for the stability of the velocity loop. Consider a hypothetical case where the system is at rest and the velocity controller 428 is using only the average of all the present wheel speeds as feedback. If forward speed is desired, the slide can be moved forward. As the slide moves forward, there is a reaction force on the chassis which can cause the wheels to roll backwards. This rolling backwards can increase the velocity error and push the slide further forward, which in turn can increase the backward rolling and so forth creating positive feedback. By taking the vehicle velocity to be the sum of the average of the present wheel and slide speeds this undesired response can be remedied because as the wheels are moving back the slide can be moving forward which can have the tendency to cancel the effect.

The reverse mode of operation can be implemented by setting limits on the velocity target based upon the forward/reverse state. In the reverse mode some small speed limit can be allowed (e.g., less than 3 mph) and in forward mode no reverse motion can be allowed. Forward motion commands can be allowed in both modes; forward mode can be thought of as a reverse motion inhibit mode. Transitions between modes can be regulated by system dynamic data and a mode input switch (e.g., operable by a user or autonomous controller). In one embodiment, to enable reverse mode when in forward mode, the criteria can be: the system speed must be low, the velocity target must be low, and the forward/reverse mode button must be pressed. The request can be not latched. To enable forward mode when in reverse mode, one can toggle modes with same criteria for entering reverse mode or push the throttle input forward if the system is at zero speed.

Referring to FIG. 5, an exemplary method for controlling the speed of the vehicle includes determining position of the coupling structure support portion relative to the position of the coupling assembly platform portion (step 504). The method also includes controlling torque applied by the at least one wheel to an underlying surface by commanding the coupling structure to vary the position of the support portion relative to the platform portion while maintaining the platform level, or some other desired orientation (e.g., a desired variation near level) (step 508). In some embodiments, the slide position controller (e.g., controller 446 of FIG. 4) specifies the support portion of the coupling structure move to a specific position relative to the platform portion of the coupling structure, causing a pitch moment on the vehicle which creates commands in the dynamic balance controller, which causes the wheel motor drive 424 to cause the wheel to apply torque to the underlying surface to achieve a desired speed for the vehicle. In some embodiments, the specific position may vary depending on the vehicle operating mode. For example, when the vehicle operating mode is a forward mode, the system may limit the rate at which the vehicle speed can be increased or decreased by controlling or limiting the position. Additionally, a reverse mode can impose alternate limits on vehicle speed including inhibiting any motion at all. Zero-speed, station-keeping behaviors can be achieved through automatically adjusting the slide position; this can be done in the presence of external disturbances such as wind or slope, as well as a shift in the vehicle center of gravity.

The method also includes receiving a vehicle speed command value (step 512) from a user or controller and varying the position of the support portion relative to the platform portion to control the torque applied by the at least one wheel to the underlying surface to achieve the vehicle speed command value. The method also includes receiving speed feedback signals (step 516) from the at least one wheel, coupling structure speed, or both to command the coupling structure to vary the position of the support portion relative to the platform portion to control the torque applied by the at least one wheel to the underlying surface to control the speed of the vehicle.

In some embodiments, the vehicle controller includes a speed limiter module (e.g., speed limiter 432 of FIG. 4) configured to constrain the size of a speed command signal (430 of FIG. 4) to constrain the torque applied by the at least one wheel to the underlying surface to constrain the speed of the vehicle over a period of time in response to varying the position of the support portion relative to the platform portion over the period of time. For example, a maximum speed limit can be enforced by modifying or limiting the slide position when the maximum speed is reached.

Propulsion Effort Limiting

The "effort capability" of a vehicle propulsion system can be estimated to ensure the effort required to propel the vehicle is within the capability of the system. In one embodiment, the effort limiter is a closed-loop controller that has the primary function of limiting the amount of effort or torque required by the propulsion system by regulating, limiting, or modifying the vehicle motion. Both longitudinal and yaw motion, and therefore effort, can be controlled to maintain propulsion capability margins that are required for balancing pitch stability. This control can be achieved by directly limiting or modifying the slide position, the yaw acceleration or rate, or all as a function of propulsion drive current feedback and propulsion current capability estimate.

The effort limiter can use maximum drive current and the minimum calculated current capability estimate feedback data. Methods and mechanisms for current capability estimation (CCE) are described herein. The maximum drive current (MDC) can be taken as the maximum instantaneous current magnitude of all vehicle propulsion drives. The current capability estimate (CCE) can be taken as the minimum between the calculated estimates from both sides of the vehicle and is essentially equal to the present current limit of the propulsion system. The CCE can be used to generate a current threshold above which the proportional term of the effort limiter controller is active. The threshold can be calculated as the difference between the CCE and a current band, so the current threshold can be a level some delta below the level of the CCE. In some embodiments, the current band varies with speed and provides more torque margin at higher speeds approaching the no-load speed of the motor.

In vehicles with electric drives, there can be different limitations on capability in the motoring versus regeneration quadrants of their torque/speed operating domain. In some embodiments, the effort limiter has different behaviors in the motoring versus the regeneration quadrants to maximize performance in each of the quadrants according to the performance constraints of each of the quadrants. For example when near the no-load speed in the motoring quadrant there can be little acceleration capability available compared to the amount of deceleration capability in the regeneration quadrant at the same speed. Having different behaviors in the different quadrants can preserve braking capability when compared to using the same limits in all quadrants.

In one embodiment, the effort limiter has two terms. The first term can be the product of the magnitude of the derivative of the filtered MDC and a gain. As the derivative term increases in magnitude the slide limit and yaw target limit can be pulled down to slow the rate at which the required MDC increases. This can act as a damper allowing a stable response when the MDC enters the proportional band. The second term can be the product of the difference between the current threshold and the MDC and a gain. This term returns zero when the MDC is below the current threshold, meaning it is only active when the MDC is in the band between the CCE and the current threshold. The smaller the size of the band, the less the vehicle performance is inhibited, but at the cost of increasing the stiffness of the effort limiter response which can become more oscillatory because of the increased gain on the term. The size of this "proportional band" can be important to balancing the tradeoff of peak machine performance and controller stability. In some embodiments the size of this band can vary depending on the present speed of the system. This allows for improvements in acceleration performance at low speeds when the system is far away from the limits, increases in balancing margins at higher speeds where acceleration performance isn't as important, and additional flexibility in tuning controller stability.

The output of the effort limiter can consist of the sum of the two terms, dual rate limited. This output can be subtracted from the absolute limit imposed by the system for slide position and yaw rate target. The dual rate limiting can be used to allow the generated limit to decrease at a higher rate and increase at a lower rate. So the controller can pull the limit down quickly and let it go back up more slowly. This can enable increasing the stiffness and therefore reducing the response time of the effort limiter while reducing the occurrence of oscillatory behavior. The slide effort limit can be imposed during balancing operation only, so that the transients during landing and takeoff do not pull down the slide limit and affect behaviors in those states where effort limiting of the propulsion drives is not as critical. When the desired slide position generated in the velocity controller is less than the attenuated limit generated in the effort limiter a flag can be sent to saturate the integrators in the velocity controller at the present values. This can be done to keep the integrators from winding up while the slide position is being limited.

The yaw rate (rate of turning about a vertical axis of a vehicle perpendicular to both longitudinal and lateral directions) can be used to create a feed-forward term into the effort limiter which can limit longitudinal (fore/aft) acceleration to preserve yaw or directional control. High longitudinal acceleration combined with a high yaw rate can create a large yaw moment that must be supported by the propulsion motors. In order to preserve balance function, the sum of the longitudinal and yaw efforts must be kept under the limit of the propulsion system. In one embodiment, longitudinal effort can be reduced when yaw effort is high to preserve balance and steering capability over longitudinal acceleration and deceleration performance. In other embodiments longitudinal effort can be used to limit or reduce yaw effort while maintaining balance.

Figure 6:
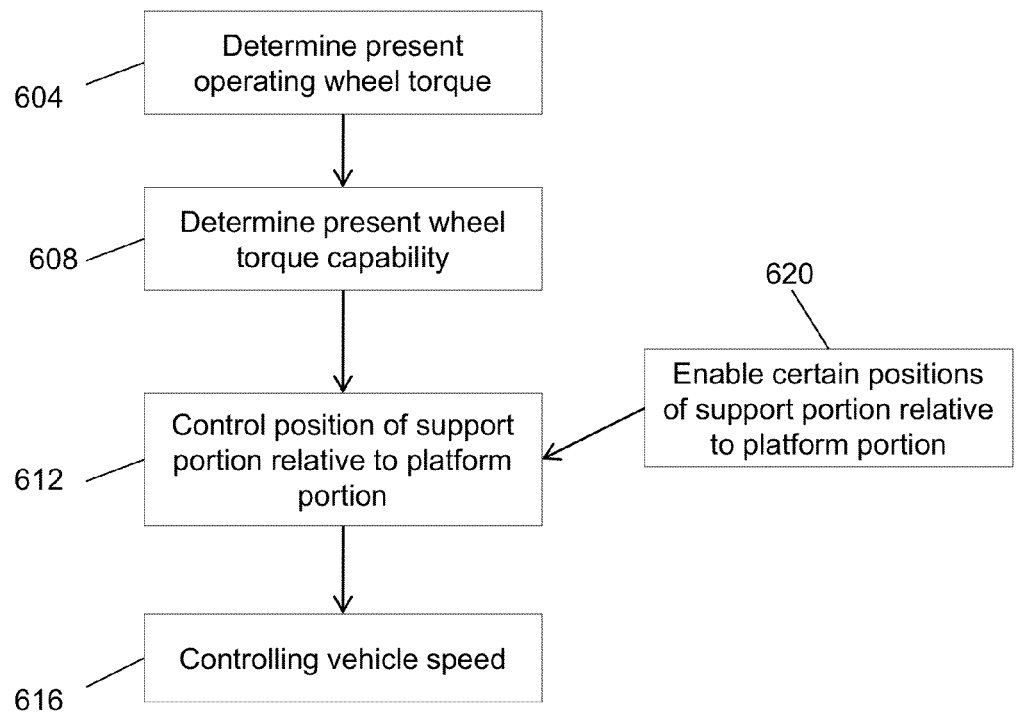
FIG. 6 is a flowchart of a method for maintaining balancing margin for a dynamically-balancing vehicle, according to an illustrative embodiment of the invention.

FIG. 6 is a flowchart of a method for effort limiting to maintain balancing margin for a dynamically-balancing vehicle (e.g., the vehicle 100 of FIG. 1. using the controller 400 of FIG. 4). The method includes determining present operating wheel torque for the vehicle 604 and determining present wheel torque capability of the vehicle 608, which are described herein (e.g., section entitled Motor Current Capability Estimation).

The method also includes controlling 612 (i.e., enabling the effort limiter 444) the coupling structure (e.g., coupling structure 172 of FIG. 1) to control the position of the support portion relative to the platform portion (with the slide actuator 450) based on the present operating wheel torque and the present wheel torque capability to maintain propulsion capability margins required for balancing the vehicle. The method also includes controlling the speed of the vehicle 616 based on, for example, an input by a user (input 402 of FIG. 4) subject to the requirement that the vehicle remain balancing.

In some embodiments, the method includes enabling the coupling structure to only command positions that maintain balance of the vehicle 620. By way of example, the controller 400 of FIG. 4 may be configured so the effort limiter 444 may only enable the slide position controller 446 to command the support portion of the coupling structure to take on certain positions relative to the platform portion of the coupling structure. In other embodiments, the controller may attenuate or modify the slide position to preserve the balance of the vehicle.

CG Offset

The CG (center of gravity) offset is typically a measurement or estimate of the physical position difference from a predefined fixed slide zero position that is required for the vehicle to balance in place with the platform level. The CG offset can vary depending on passengers and cargo both between uses and during use of the vehicle, and therefore determining it both at startup and during operation is an important function. The CG offset and changes in it during operation can affect the performance of velocity controller, pitch controller, and effort limiter (e.g., velocity controller 428, pitch controller 406, and effort limiter 432 of FIG. 4). Using the determined CG offset in the velocity controller can reduce the magnitude required by the integral term and therefore the likelihood of saturating the integrator in various conditions. In the pitch controller it can affect the slide pitch offset; centering slide travel at the CG offset results in the machine being level at zero speed. In the effort limiter the CG offset can play a critical role in where the slide position gets limited, because, while the effort limiter limits the slide position, it does so to control the placement of the CG of the coupling structure support. If the CG offset is not taken into account in the effort limiter and there is a large shift the longitudinal position of the CG (like from a payload shift) the machine can become vulnerable to drive saturation and pitch instability.

Figure 7:
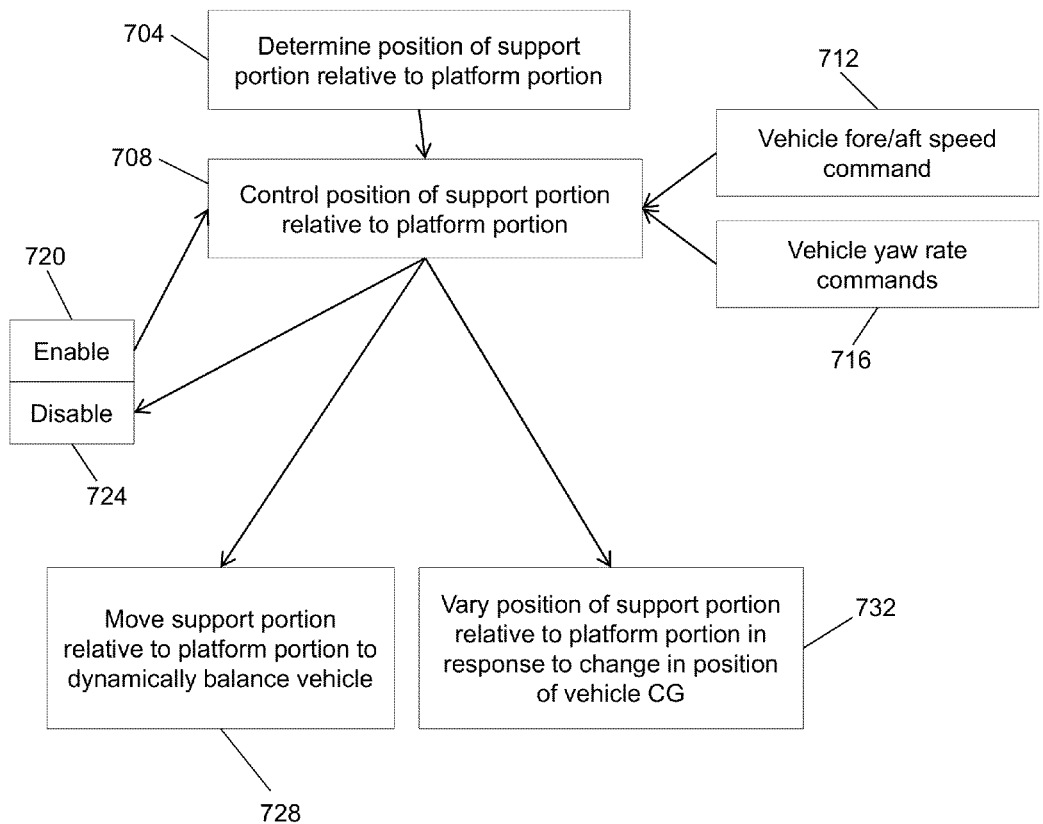
FIG. 7 is a flowchart of an exemplary method for dynamically balancing a vehicle by controlling the position of the center of gravity of the vehicle, according to an illustrative embodiment of the invention.

FIG. 7 is a flowchart of an exemplary method for dynamically balancing a vehicle (e.g., vehicle 100 of FIG. 1) by controlling the position of the center of gravity of the vehicle (using, for example, the controller 400 of FIG. 4), according to an illustrative embodiment of the invention. The method includes determining 704 position of the coupling structure support portion (e.g., support portion 172*a*) relative to the coupling structure platform portion (e.g., platform portion 172*b*). The method also includes controlling 708 position of the coupling structure support portion relative to the coupling structure platform portion to move the position of the vehicle center of gravity while dynamically balancing the vehicle.

The method also includes moving 728 the support portion relative to the platform portion to dynamically balance the vehicle while the vehicle is at a commanded rest position relative to an underlying surface and the support is at least substantially level. By way of example, the moving step (728) may be performed when the vehicle is in operating in a takeoff or landing mode. The method also includes varying 732 position of the support portion relative to the platform portion in response to a change in the position of the vehicle center of gravity. In some embodiments, controlling position of the support portion relative to the platform portion is performed in response to receiving vehicle fore/aft speed commands 712, yaw rate commands 716, or both.

In some embodiments, the controller disables 724 the step of controlling position during vehicle takeoff and landing modes. The controller is also configured to enable the step of controlling position after the vehicle enters a balancing mode from the takeoff mode.

In some embodiments, the CG offset is updated by averaging the combined slide position for a period of time when the system is considered to be at rest. A variety of criteria may be considered for triggering an update of the CG offset; some or all of which can be enabled. For example, one criterion is the velocity and yaw targets/commands are low for a period of time. This allows the system to settle before starting to check the other criteria and starting the average. It allows the vehicle to have wider thresholds for other triggering criteria. Another criterion is the vehicle is in the balanced running state. This criterion avoids updating the CG offset during takeoff or landing where the machine can be significantly pitched thus requiring the slide position to be far away from where the actual CG position is likely to be when level.

Another criterion is the present maximum propulsion drive current magnitude of all the motor drives is low. This criterion helps deal with the case where the vehicle is on a slope. If an update is made when on a slope, it can adversely affect the effort limiter. When stationary on a slope, the motor current is not low. Some effort is required to hold the vehicle on the slope which also requires the slide to be positioned to cause the holding force, if the CG offset were updated it could end up being different than that required on level ground. Another criterion is the present maximum slide drive current magnitude for the slide actuator drives is low. If the cabin (e.g., enclosure, support, and support portion of the coupling structure) is externally disturbed the propulsion drive currents can be low and speed can be low but the slide current can be higher and the slide position error can be significant thus producing an error in the CG offset.

Another criterion is the cabin acceleration is low. By primarily using wheel speed as the indicator of cabin acceleration, the CG offset can update right at the end of deceleration when the slide has not completely come to rest but is within the bounds for updating the CG offset. Requiring low acceleration helps avoid this issue. Another criterion is the sensed slide velocity is low. If the slide is moving or there is a noisy velocity signal, this can appear as a non-zero velocity and the CG offset may be in error.

Another criterion is the wheel velocity is low. Slide positions required to overcome losses associated with motion can result in a CG offset that is not applicable when at rest. Another criterion is the yaw rate (derived from wheel speed) is low. Small transients in slide position that occur when the vehicle is yawing can couple into the position average. Another criterion is the reverse mode is disabled. The vehicle speed passes through zero for most of the other criteria when transitioning from forward to reverse, therefore disable the update when reverse mode is enabled. In some embodiments, these at-rest (or substantially at-rest) conditions can be required to persist for 0.5 s, during which an average slide position can be computed and the CG offset can be updated. The updated offset can then be low-pass filtered to eliminate any transient disturbance as the updated CG offset is introduced to the controllers.

When the machine enters a standby mode, the flag that indicates when the CG offset has updated can be set to FALSE. This can enable the CG offset to update every time the machine enters balance mode. Thus, if any weight has shifted when the machine is statically stable, such as when boarding a new passenger, the machine can update the new CG offset when it enters the balanced running mode. When the balance mode is entered the machine can hold the motion commands to zero until the CG offset updates. If the machine does not update within a period of time, the update can be forced with a very long average for the slide position. This can ensure that if the update failed because of, for example, a noise issue of some sort, or some environmental factor like wind or slope, the CG offset can still update. If a CG offset update is within some range of the previous, the update can be ignored. This can be done because small updates do not need to be introduced since they will not significantly affect the system performance.

Motor Current Capability Estimation

Propulsion system performance can be reduced as needed to maintain vehicle voltage/speed margin or "headroom". Indirectly, this also maintains some wheel motor current or torque margin. It is really this torque margin that is desired to be preserved. Since wheel motor torque may be defined as twisting effort, and since a propulsion effort-limiting algorithm has been successfully implemented, performance monitoring may now be based on maintaining effort margin. Since wheel motor current translates to effort at the propulsion motors, the approach here is to estimate the motor current capability based on the state of the battery and as a function of motor speed. This capability estimate can apply to each of the two redundant halves of the propulsion system if redundancy is utilized. As such, it can be used in a way to preserve enough effort margin to maintain balance of the vehicle with both redundant sides running (i.e., two motor drives; each one driving a wheel of the vehicle), or to preserve the margin required to continue to balance even when one side of the redundant propulsion system goes off line.

The current capability estimator (CCE) estimates the capability of the system to produce wheel motor current at the present speed using the present battery state estimator (BSE) (see, for example, FIGS. 8A and 8B) values for open circuit voltage and DC internal resistance. The current limit imposed by the motor drive is included in this estimate. The capability estimate provided is equal to or somewhat below the actual wheel motor current capability of the system over the full range of operating speed. These margins may be tuned to be useful to the effort limiter function in ensuring that balancing capability is preserved during balancing operations. The capability estimate is equal to or less than the actual current capability of the system over the full range of operating speed. It can eliminate the need for limiting speed based on voltage margins as done for prior art systems.

Figure 8A:
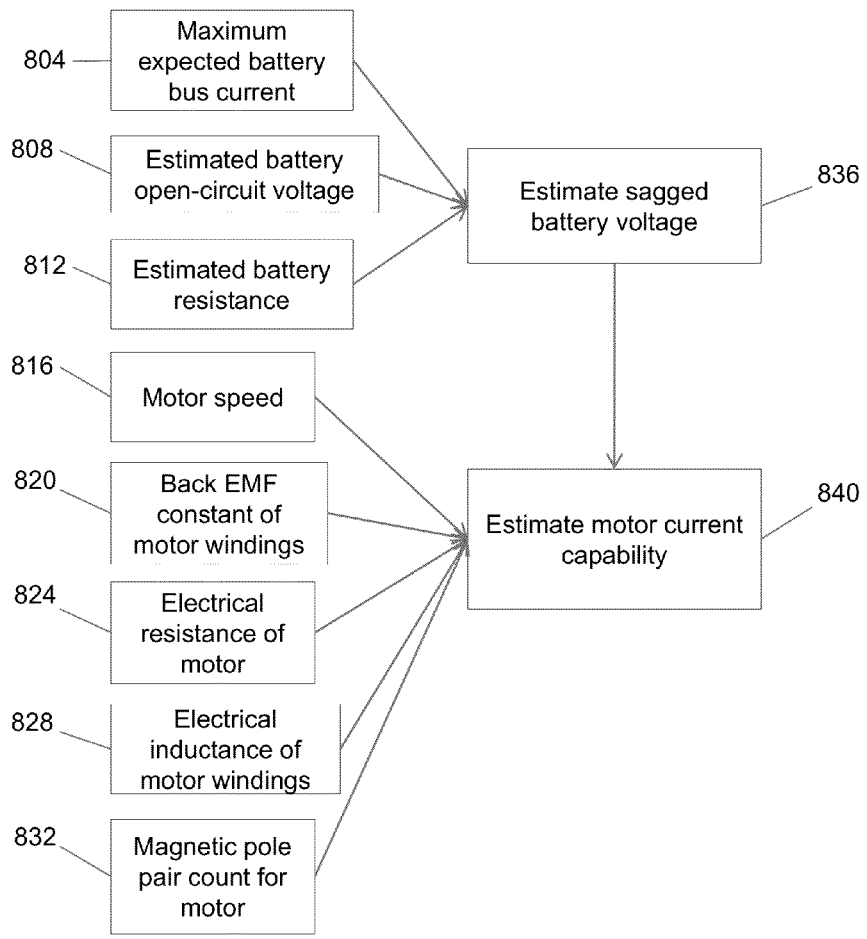
FIG. 8A is a flowchart of a method for determining motor current capability for a battery powered vehicle, according to an illustrative embodiment of the invention.

FIG. 8A is a flowchart of a method for determining motor current capability for a battery powered vehicle, according to an illustrative embodiment of the invention. An estimate of the voltage the DC bus can sag to, at a given operating speed, is needed. This voltage can be difficult to estimate accurately without using iterative techniques because the motor current is translated to a battery power load through the motor drive, that power causes the battery voltage to drop, that drop causes the battery current to rise, that rise causes the battery voltage to drop further. Therefore, the approach used here keeps the method simple with the drawback of giving a conservative estimate at higher motor speeds. Thus, the voltage is conservatively estimated based on the assumption that the battery current is the maximum ever expected The method includes estimating (step 836) a sagged battery voltage for a vehicle battery during operation based on a predetermined maximum expected battery bus current of the vehicle battery during operation 804, an estimated battery open-circuit voltage (808), and an estimated battery resistance (812).

Figure 8B:
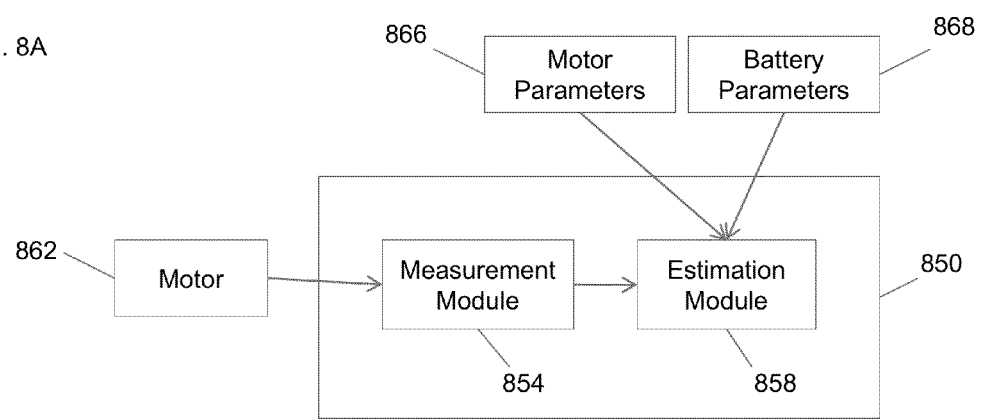
FIG. 8B is a schematic illustration of an apparatus for determining motor current capability for a battery powered vehicle, according to an illustrative embodiment of the invention.

In one embodiment, the sagged battery voltage is estimated in accordance with:

$$V_{bat\_sag} = V_{oc} - I_{bat\_max} * R_{bat} \qquad \text{EQN. 4}$$

where $V_{bat\_sag}$ is the estimated sagged battery voltage, $V_{oc}$ is estimated battery open-circuit voltage (as determined, for example, with respect to FIGS. 8A and 8B), $I_{bat\_max}$ is the predetermined maximum expected battery bus current (as determined, for example, with respect to FIGS. 8A and 8B or, via simulation), and $R_{bat}$ is the estimated battery resistance (as determined, for example, with respect to FIGS. 8A and 8B).

The method also includes estimating (step 840) the motor current capability for the battery powered vehicle based on operational speed of a motor 816 used to propel the battery powered vehicle, back EMF constant of the motor (820), electrical resistance of the motor windings (824), the sagged battery voltage (step 836), electrical inductance of the motor windings (828), and magnetic pole pair count for the motor (832). The operational speed of the motor (816) is typically a measured parameter. The back EMF constant of the motor windings (820), electrical resistance of the motor windings (824), electrical inductance of the motor windings (828), and magnetic pole pair count for the motor (832) are predetermined specifications for the vehicle motors typically supplied by the motor manufacturer.

In one embodiment, the motor current capability for the battery powered vehicle is determined in accordance with:

$$I_{mot\_max}(Spd) = \frac{2}{\sqrt{3}} * \frac{-K_e * |Spd| * R_{mot} + \sqrt{V_{bat\_sag}^2 * [R_{mot}^2 + (PP*Spd*L_{mot})^2] - (K_e*Spd^2*PP*L_{mot})^2}}{R_{mot}^2 + (PP*Spd*L_{mot})^2} \qquad \text{EQN. 5}$$

where $I_{mot\_max}$ is the motor current capability, Spd is the operating speed of the motor, $K_e$ is the line-to-line back EMF constant of the motor windings, $R_{mot}$ is the line-to-line resistance of the motor windings, PP is the magnetic pole pair count for the motor, and $L_{mot}$ is the line-to-line inductance of the motor windings.

In some embodiments, the method also includes limiting the motor current capability that is available for the battery powered vehicle (or which the vehicle control system is allowed to use) based on a current limit of a motor drive for driving the motor in accordance with:

$$I_{mot\_cap}(Spd) = \min(I_{mot\_lim}, I_{mot\_max}(Spd)) \qquad \text{EQN. 6}$$

where $I_{mot\_lim}$ is a prespecified current limit of the motor drive (e.g., specified by the motor manufacturer) or a dynamically-adjusted current limit fed back to the vehicle control system from the motor drive.

In some embodiments, the method also includes limiting the value of the operating speed of the motor used in the estimation to a maximum no-load speed of the motor based on $V_{bat\_sag}$ in accordance with:

$$Spd_{NoLoadEst} = \frac{V_{bat\_sag}}{K_e} \qquad \text{EQN. 7}$$

where $Spd_{NoLoadEst}$ is the maximum no-load speed.

FIG. 8B is a schematic illustration of an apparatus 850 for determining motor current capability for a battery powered vehicle, according to an illustrative embodiment of the invention. The apparatus 850 may practice, for example, the method of FIG. 8A. The apparatus 850 includes a measurement module 854 for measuring the operational speed of the vehicle motor 862. The apparatus 858 also includes an estimation module 858 for estimating the sagged battery voltage and the motor current capability based on the various motor parameters 866 and battery parameters 868.

Battery Electrical State Estimation

A wide range of power sources are known for powering electrical loads. Characterizing a power source's power delivery capabilities can be beneficial for knowing the end of discharge point or available output power of the power source. In cases where the power source (e.g., a battery) provides power to an electrical load (e.g., electric motor) that creates propulsion for a transporter, understanding the power source's power delivery capabilities permits determination of, for example, the maximum operating speed of the transporter.

Figure 9A:
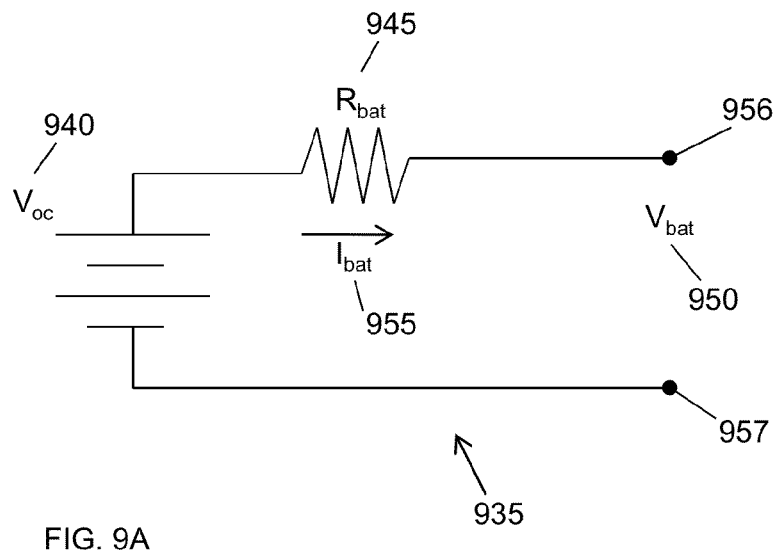
FIG. 9A is a circuit diagram of a battery, according to an illustrative embodiment of the invention.

FIG. 9A is a circuit diagram model of a battery 935, according to an illustrative embodiment of the invention. The battery 935 can drive an electrical load, such as an electrical motor used in a transporter. The battery 935 can be modeled as an open circuit voltage source ($V_{oc}$ 940) with internal impedance ($R_{bat}$ 945) and current flowing in the circuit ($I_{bat}$ 955). The battery voltage ($V_{bat}$ 950) can be measured at the terminals 956 and 957.

Figure 9B:
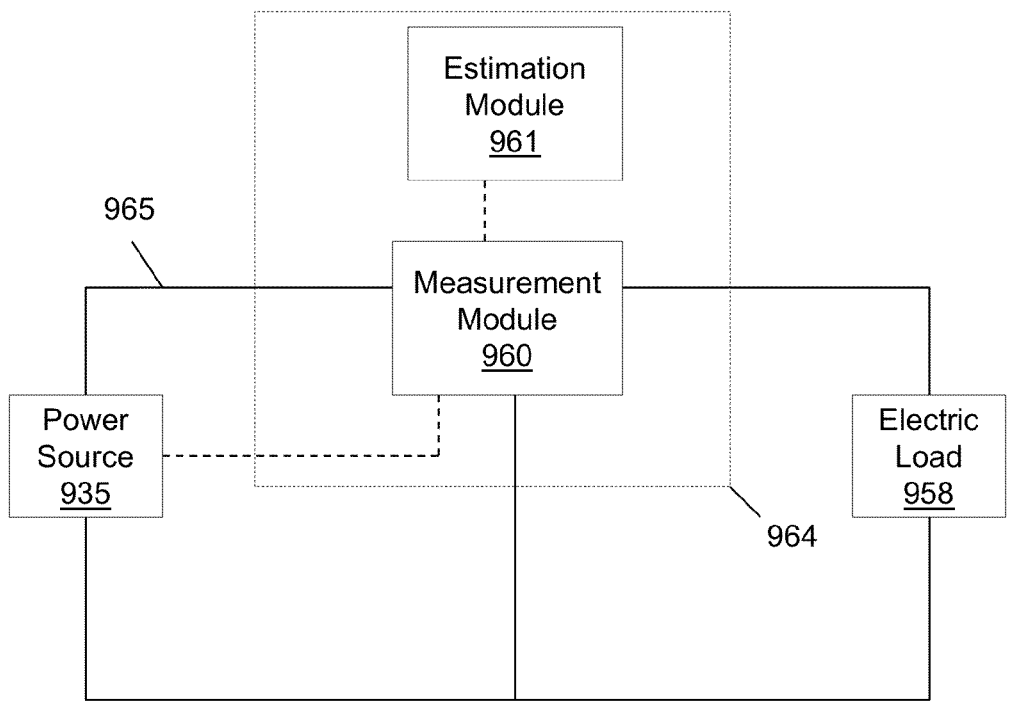
FIG. 9B is a schematic illustration of an apparatus for estimating an electrical state of the battery of FIG. 9A, according to an illustrative embodiment of the invention.

FIG. 9B is a schematic illustration of an apparatus 964 (Battery State Estimator "BSE") for estimating an electrical state of the battery 935 of FIG. 9A, according to an illustrative embodiment of the invention. A function of the BSE is to estimate the performance characteristics of the battery based on a varying "open-circuit" voltage source ($V_{oc}$) and varying series DC resistance (Rbat) model of the battery using the measured battery current 955 and terminal voltage 950 as inputs. Rbat and Voc are then used by the system in, for example, estimating the motor current capability (CCE) which is in turn used to limit the propulsion effort commanded to ensure that pitch stability is maintained. Voc may also be used in determining the end of discharge (empty battery) criteria.

In the presence of rapidly changing battery current (richness in the data), the voltage and current relationship of the battery (its resistance) may be determined immediately by the ratio of the difference of the battery voltage divided by the difference of the battery current. Voc changes slowly and may be known when little or no battery current is being drawn as $V_{bat}=V_{oc}$. Voc may be calculated based on Vbat and resistive voltage drop in the battery when more current is being drawn. A more immediate and accurate estimate of Rbat and Voc than done in prior art systems may therefore be determined. Since the Voc estimate depends on a good Rbat estimate, a quickly responding/converging Rbat estimate is desirable. And since the Rbat estimate can respond quickly to changes in actual battery resistance, it is possible (and desirable) to seed Rbat with something closer to the expected value of the battery resistance (1.7 ohm in an exemplary embodiment) instead of a wildly conservative value (4.8 ohms in an exemplary embodiment) as done for prior art systems. Then, in the case of a high actual battery resistance, Rbat can reflect that condition almost immediately (within a second or two) after richness is sustained in the input data. The output can be low-pass filtered to avoid instantaneous changes in Rbat or Voc.

Referring to FIG. 9B, power source (battery) 935 drives an electric load 958. The apparatus 964 includes an input 965 for receiving initial values of battery parameters. The apparatus 964 includes a measurement module 960 that is configured to acquire values of the battery voltage ($V_{bat}$ 950) and the battery current draw ($I_{bat}$ 955). The apparatus 964 also includes an estimation module 961 configured to calculate battery resistance ($R_{bat}$) based on the change in battery voltage (delta $V_{bat}$) and change in battery current draw (delta $I_{bat}$).

The estimation module 961 is also configured to calculate open-circuit battery voltage ($V_{oc}$) based on the calculated battery resistance ($R_{bat}$), the battery current draw ($I_{bat}$), and the battery voltage ($V_{bat}$).

Figure 9C:
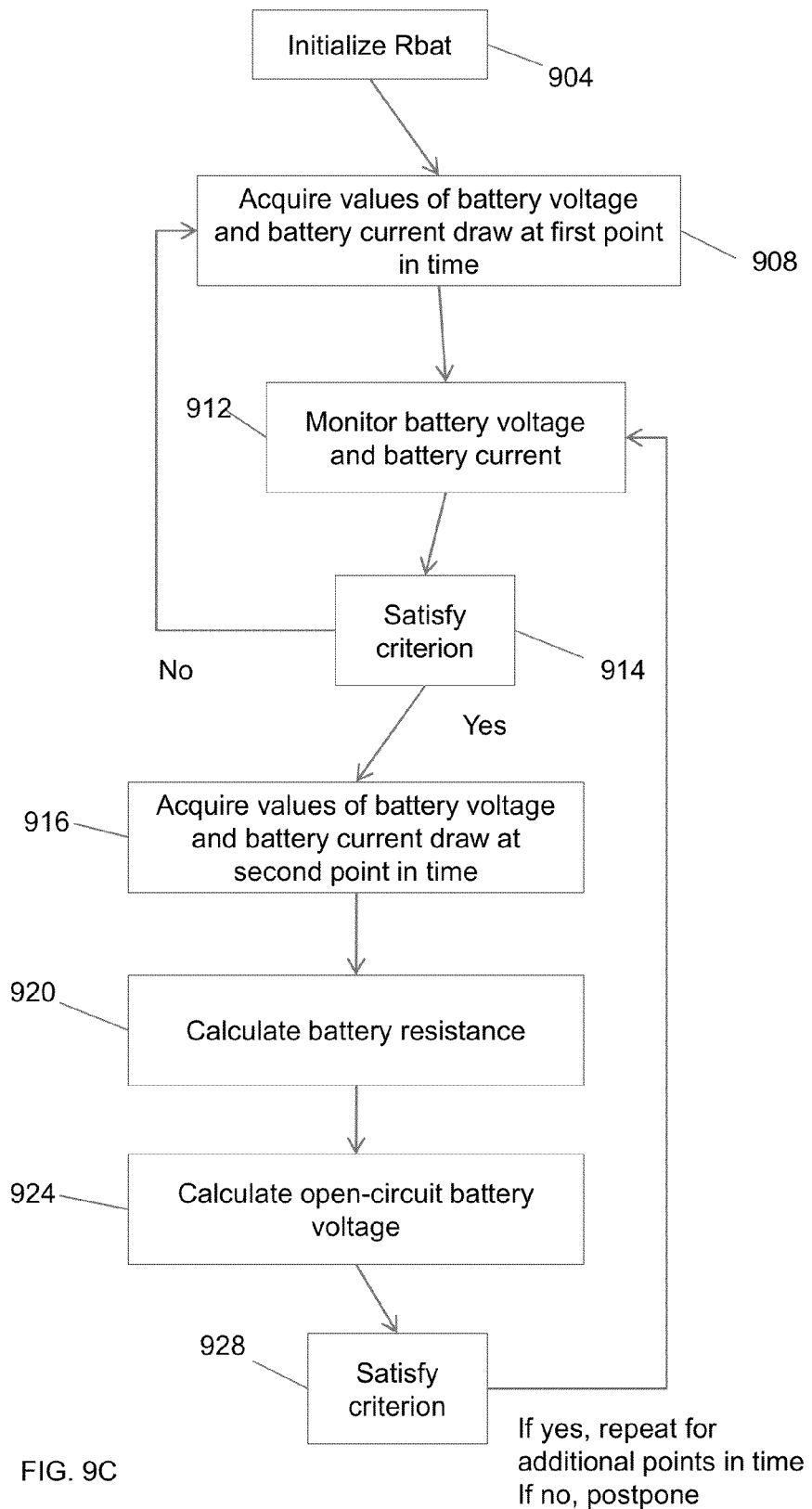
FIG. 9C is a flowchart of a method for estimating the electrical state of a battery, according to an illustrative embodiment of the invention.

FIG. 9C is a flowchart of a method for estimating the electrical state of a battery using, for example, apparatus 964 of FIG. 9B. The method includes initializing the value of $R_{bat}$ (step 904) to a reasonable expectation of $R_{bat}$ for most situations. A reasonable value of $R_{bat}$ is the most likely case and because the algorithm is capable of converging on the correct value of $R_{bat}$ very quickly as battery current is drawn, a high-resistance battery condition can be detected essentially immediately. Slewing or filtering of signals will affect how quickly this may occur. Accordingly in one embodiment, a conservative value of $R_{bat}$ is selected that is on the higher range of expected values (e.g., 1.7 ohm).

The method also includes acquiring values of the battery voltage ($V_{bat}$ 950) and the battery current draw ($I_{bat}$ 955) at a first point in time (step 908). The method also includes monitoring (step 912) battery voltage ($V_{bat}$ 950) and battery current draw ($I_{bat}$ 955). The method also includes acquiring (step 916) values of the battery voltage ($V_{bat}$ 950) and battery current draw ($I_{bat}$ 955) at a second point in time when the change in battery voltage and the battery current draw between the first and second points in time satisfies a predetermined criterion (914). Monitoring the change in $V_{bat}$ makes the algorithm more sensitive if the battery resistance is high, thus helping to detect a high battery resistance condition more quickly.

In this embodiment, the predetermined criterion is satisfied when the change in battery voltage ($V_{bat}$ 950) between the first and second points in time (e.g., within about 2 seconds) is greater than a predetermined voltage amount (e.g., greater than ±2.0 V) and the change in battery current draw ($I_{bat}$ 955) between the first and second points in time is greater than a predetermined current amount (e.g., non-zero, greater than ±0.1 A). A change of ±2.0 V typically requires a ±1.4 A delta for a healthy (1.4 ohm) battery. Using a non-zero value for delta $I_{bat}$ avoids division by zero when calculating $R_{bat}$. A change in current of ±0.1 A allows battery resistance to be as much as 20 ohms without inhibiting calculation. A time period of 2 seconds allows for a relatively slow-changing current to still provide an accurate estimation of the electrical state of the battery.

When the predetermined criterion is satisfied, the method includes calculating the battery resistance (step 920) based on the change in battery voltage and battery current draw between the first and second points in time in accordance with:

$$R_{bat} = \left(\frac{\text{delta } V_{bat}}{\text{delta } I_{bat}}\right) \qquad \text{EQN. 8}$$

The method also includes calculating the open-circuit battery voltage based on the calculated battery resistance, the battery current draw at the second point in time, and the battery voltage at the second point in time (step 924) in accordance with:

$$V_{oc} = V_{bat} + I_{bat} * R_{bat} \qquad \text{EQN. 9}$$

The method also includes repeating the steps at later points in time (e.g., third, fourth) if a predetermined criterion is satisfied (step 928). In one embodiment, the method includes acquiring values of the battery voltage and battery current draw at a third point in time when the change in battery voltage between the second and third points in time is greater than the predetermined voltage amount and the change in battery current draw between the second and third points in time is greater than the predetermined current amount. The method includes postponing acquiring the values while the predetermined criterion is not satisfied.

In some embodiments, calculating open-circuit battery voltage based on the calculated battery resistance, the battery current draw at the second point in time, and the battery voltage at the second point in time (step 924) also includes determining whether a presently calculated battery resistance has changed by more than a predetermined percentage from a previously calculated battery resistance. In one embodiment, the open-circuit battery voltage is calculated (step 924) based on the calculated battery resistance if the presently calculated battery resistance has not changed by more than a predetermined percentage relative to the previously calculated battery resistance. In another embodiment, the open-circuit battery voltage is calculated (step 924) based on the previously calculated battery resistance if the presently calculated battery resistance has changed by more than a predetermined percentage relative to the previously calculated battery resistance.

Some transients, especially when the actual battery resistance suddenly changes (like when testing with a switchable resistance) can cause the $R_{bat}$ estimate to be extremely high (±80 ohms), for one update. By limiting the range of permissible values for $R_{bat}$ to a prespecified range (e.g., 1 to 15 ohms), the value of $R_{bat}$ used in the calculation is kept to a reasonable value for $R_{bat}$. In some embodiments, $R_{bat}$ is limited to changes of ±10% between updates. This aids in preventing large, unrealistic excursions of $R_{bat}$. This is important, because $R_{bat}$ excursions affect $V_{oc}$. And the estimate can be impacted if a large, unrealistic change occurs at a point in time when the system acquires new values. The adverse impact can be limited by imposing the Rbat change limit. Using a percentage rather than a constant makes allowable changes small for small values and larger for large values of $R_{bat}$.

In some embodiments, steps 916, 920 and 924 are suspended during predetermined operating conditions (e.g., during a change in operating mode (e.g., landing, takeoff)) for a vehicle being power by the battery. In some embodiments, steps 916, 920 and 924 are suspended when the vehicle is regeneratively braking for a predetermined period of time.

In various embodiments, the disclosed methods can be implemented as a computer program product for use with a computer system. Such implementations can include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium can be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems.

Furthermore, such instructions can be stored in any memory device, such as semiconductor, magnetic, optical or other memory devices, and can be transmitted using any communications technology, such as optical, infrared, microwave, or other transmission technologies. It is expected that such a computer program product can be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention can be implemented as a combination of both software (e.g., a computer program product) and hardware. Still other embodiments of the invention are implemented as entirely hardware, or entirely software (e.g., a computer program product).

The described embodiments of the invention are intended to be merely exemplary and numerous variations and modifications will be apparent to those skilled in the art. All such variations and modifications are intended to be within the scope of the present invention as defined in any appended claims.

The invention claimed is:

1. A method for determining motor current capability for a battery powered vehicle, the method comprising:

estimating, via an estimation module, a sagged battery voltage for a vehicle battery during operation based on:
a) a predetermined maximum expected battery bus current of the vehicle battery during operation, wherein the expected battery bus current is a current to which the battery current rises due to the sagging of the battery voltage,
b) an estimated battery open-circuit voltage, and
c) an estimated battery open-circuit resistance;
wherein the sagged battery voltage is a voltage to which a DC bus of the vehicle battery sags at a maximum expected operating speed of the battery powered vehicle, and the estimated sagged battery voltage for a vehicle battery during operation is estimated in accordance with:

$$V_{bat\_sag} = V_{oc} - I_{bat\_max} * R_{bat},$$

where $V_{bat\_sag}$ is the estimated sagged battery voltage, $V_{oc}$ is estimated battery open-circuit voltage, $I_{bat\_max}$ is the predetermined maximum expected battery bus current, and $R_{bat}$ is the estimated battery open-circuit resistance, and estimating, via the estimation module, motor current capability for the battery powered vehicle based on:
d) operational speed of a motor propelling the battery powered vehicle,
e) back EMF constant of the motor windings,
f) electrical resistance of the motor windings,
g) the estimated sagged battery voltage,
h) electrical inductance of the motor windings, and
i) magnetic pole pair count for the motor;
wherein the motor current capability for the battery powered vehicle is estimated in accordance with:

$$I_{mot\_max}(Spd) = \frac{2}{\sqrt{3}} * \frac{-K_e * |Spd| * R_{mot} + \sqrt{V_{bat\_sag}^2 * [R_{mot}^2 + (PP*Spd*L_{mot})^2] - (K_e*Spd^2*PP*L_{mot})^2}}{R_{mot}^2 + (PP*Spd*L_{mot})^2}$$

where $I_{mot\_max}$ is the motor current capability, Spd is the operating speed of the motor, $K_e$ is the line-to-line back EMF constant of the motor windings, $R_{mot}$ is the line-to-line resistance of the motor windings, PP is the magnetic pole pair count for the motor, and $L_{mot}$ is the line-to-line inductance of the motor windings.

2. The method of claim 1, comprising limiting the motor current capability ($I_{mot\_cap}$(Spd)) for the battery powered vehicle based on a current limit of a motor drive for driving the motor in accordance with:

$$I_{mot\_cap}(Spd)\ \text{Minimum}(I_{mot\_lim}, I_{mot\_max}(Spd))$$

where $I_{mot\_lim}$ is the current limit of the motor drive.

3. The method of claim 2, comprising limiting the value of the operating speed of the motor used to a maximum no-load speed of the motor based on Vbat_sag in accordance with:

$$Spd_{NoLoadEst} = \frac{V_{bat\_sag}}{K_e},$$

where $Spd_{NoLoadEst}$ is the maximum no-load speed.

4. An apparatus for determining motor current capability for a battery powered vehicle, the apparatus comprising:
   a measurement module configured to:
      measure operational speed of a motor used to propel the battery powered vehicle; and
   an estimation module configured to:
      estimate a sagged battery voltage for a vehicle battery during operation based on:
      a) a predetermined maximum expected battery bus current, wherein the expected battery bus current is a current to which the battery current rises due to the sagging of the battery voltage,
      b) an estimated battery open-circuit voltage,
      c) an estimated battery open-circuit resistance;
      wherein the sagged battery voltage is a voltage to which a DC bus of the vehicle battery sags at a maximum expected operating speed of the battery powered vehicle, and the estimated sagged battery voltage for a vehicle battery during operation is estimated in accordance with:

$$V_{bat\_sag} = V_{oc} - I_{bat\_max} * R_{bat},$$

where $V_{bat\_sag}$ is the estimated sagged battery voltage, $V_{oc}$ is estimated battery open-circuit voltage, $I_{bat\_max}$ is the predetermined maximum expected battery bus current, and $R_{bat}$ is the estimated battery open-circuit resistance, and estimate motor current capability for the battery powered vehicle based on:
   d) operational speed of a motor used to propel the battery powered vehicle,
   e) back EMF constant of the motor windings,
   f) electrical resistance of the motor windings,
   g) the estimated sagged battery voltage,
   h) electrical inductance of the motor windings, and
   i) magnetic pole pair count for the motor;
   wherein the motor current capability for the battery powered vehicle is estimated in accordance with:

$$I_{mot\_max}(Spd) = \frac{2}{\sqrt{3}} * \frac{-K_e * |Spd| * R_{mot} + \sqrt{V_{bat\_sag}^2 * [R_{mot}^2 + (PP*Spd*L_{mot})^2](K_e*Spd^2*PP*L_{mot})^2}}{R_{mot}^2 + (PP*Spd*L_{mot})^2}$$

where $I_{mot\_max}$ is the motor current capability, Spd is the operating speed of the motor, $K_e$ is the line-to-line back EMF constant of the motor windings, $R_{mot}$ is the line-to-line resistance of the motor windings, PP is the magnetic pole pair count for the motor, and $L_{mot}$ is the line-to-line inductance of the motor windings.

5. The apparatus of claim 4, wherein the estimation module is configured to limit the motor current capability for the battery powered vehicle based on a current limit of a motor drive for driving the motor in accordance with:

$$I_{mot\_cap}(Spd) = \min(I_{mot\_lim}, I_{mot\_max}(Spd))$$

where $I_{mot\_lim}$ is the current limit of the motor drive.

6. The apparatus of claim 5, wherein the estimation module is configured to limit the value of the operating speed of the motor used to a maximum no-load speed of the motor based on $V_{bat\_sag}$ in accordance with:

$$Spd_{NoLoadEst} = \frac{V_{bat\_sag}}{K_e},$$

where $Spd_{NoLoadEst}$ is the maximum no-load speed.

* * * * *

UNITED STATES PATENT AND TRADEMARK OFFICE
CERTIFICATE OF CORRECTION

PATENT NO. : 8,688,303 B2
APPLICATION NO. : 13/036728
DATED : April 1, 2014
INVENTOR(S) : Jon M. Stevens et al.

It is certified that error appears in the above-identified patent and that said Letters Patent is hereby corrected as shown below:

In the Claims

In column 30, lines 60-61 (claim 1):

" $\frac{2}{\sqrt{3}} * \frac{\sqrt{V^2_{bat\_rag} * [R^2_{mot} + (PP*Spd*L_{mot})^2] - (K_e * Spd^2 * PP * L_{mot})^2}}{R^2_{mot} + (PP*Spd*L_{mot})^2}$ "

should read:

-- $\frac{2}{\sqrt{3}} * \frac{\sqrt{V_{bat\_rag}^2 * [R^2_{mot} + (PP*Spd*L_{mot})^2] - (K_e * Spd^2 * PP * L_{mot})^2}}{R^2_{mot} + (PP*Spd*L_{mot})^2}$ --

In column 31, lines 7-8 (claim 2):

" $I_{mot\_cap}(Spd) Minimum(I_{mot\_lim}, I_{mot\_max}(Spd))$ "

should read:

-- $I_{mot\_cap}(Spd) = Minimum(I_{mot\_lim}, I_{mot\_max}(Spd))$ --

In column 32, lines 16-17 (claim 4):

" $\frac{2}{\sqrt{3}} * \frac{\sqrt{V^2_{bat\_rag} * [R^2_{mot} + (PP*Spd*L_{mot})^2](K_e * Spd^2 * PP * L_{mot})^2}}{R^2_{mot} + (PP*Spd*L_{mot})^2}$ "

should read:

-- $\frac{2}{\sqrt{3}} * \frac{\sqrt{V_{bat\_rag}^2 * [R^2_{mot} + (PP*Spd*L_{mot})^2] - (K_e * Spd^2 * PP * L_{mot})^2}}{R^2_{mot} + (PP*Spd*L_{mot})^2}$ --

Signed and Sealed this
Twelfth Day of August, 2014

Michelle K. Lee
*Deputy Director of the United States Patent and Trademark Office*